(12) United States Patent
Matsumura et al.

(10) Patent No.: US 12,356,748 B2
(45) Date of Patent: Jul. 8, 2025

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Yusuke Matsumura, Kanagawa (JP); Takashi Machida, Kanagawa (JP); Hideo Kido, Kanagawa (JP); Ryo Fukui, Kanagawa (JP); Yu Shiihara, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 343 days.

(21) Appl. No.: 17/755,841

(22) PCT Filed: Nov. 17, 2020

(86) PCT No.: PCT/JP2020/042691
§ 371 (c)(1),
(2) Date: May 10, 2022

(87) PCT Pub. No.: WO2021/100675
PCT Pub. Date: May 27, 2021

(65) Prior Publication Data
US 2022/0415945 A1    Dec. 29, 2022

(30) Foreign Application Priority Data
Nov. 18, 2019    (JP) .................... 2019-207923

(51) Int. Cl.
*H10F 39/00*    (2025.01)
*H04N 25/77*    (2023.01)
*H10F 39/18*    (2025.01)

(52) U.S. Cl.
CPC ......... *H10F 39/8057* (2025.01); *H04N 25/77* (2023.01); *H10F 39/802* (2025.01); *H10F 39/18* (2025.01); *H10F 39/80373* (2025.01)

(58) Field of Classification Search
CPC ......... H01L 27/14623; H01L 27/14603; H01L 27/14614; H01L 27/14643; H01L 27/14663; H04N 25/77
See application file for complete search history.

(56) References Cited

U.S. PATENT DOCUMENTS

| 2004/0211885 A1 | 10/2004 | Kohno |
| 2009/0213256 A1 | 8/2009 | Kudoh |

(Continued)

FOREIGN PATENT DOCUMENTS

| CN | 101609837 A | 12/2009 |
| CN | 102196198 A | 9/2011 |

(Continued)

OTHER PUBLICATIONS

International Search Report and Written Opinion of PCT Application No. PCT/JP2020/042691, issued on Feb. 2, 2021, 13 pages of ISRWO.

*Primary Examiner* — Thanh Luu
(74) *Attorney, Agent, or Firm* — CHIP LAW GROUP

(57) ABSTRACT

A solid-state imaging device includes a light-receiving surface, a plurality of pixels each including a photoelectric conversion section that photoelectrically converts light incident through the light-receiving surface, and a separation section that electrically and optically separates each photoelectric conversion section. Each of the pixels includes a charge-holding section that holds charges transferred from the photoelectric conversion section, a transfer transistor that includes a vertical gate electrode reaching the photoelectric conversion section, and transfers charges from the photoelectric conversion section to the charge-holding sec- (Continued)

tion, and a light-blocking section disposed in a layer between the photoelectric conversion section and the charge-holding section. A plurality of the vertical gate electrodes are electrically coupled together in a plurality of first pixels adjacent to each other among the plurality of pixels.

11 Claims, 34 Drawing Sheets

(56) References Cited

U.S. PATENT DOCUMENTS

| | | |
|---|---|---|
| 2009/0303371 A1 | 12/2009 | Watanabe et al. |
| 2011/0181749 A1 | 7/2011 | Yamada |
| 2015/0279883 A1 | 10/2015 | Manouvrier et al. |
| 2016/0268322 A1* | 9/2016 | Watanabe ............ H01L 27/1464 |
| 2016/0284746 A1 | 9/2016 | Fukase et al. |
| 2017/0203954 A1 | 7/2017 | Zhang et al. |
| 2018/0033809 A1* | 2/2018 | Tayanaka ............ H01L 27/0248 |
| 2018/0156898 A1 | 6/2018 | Suzuki |
| 2019/0333951 A1 | 10/2019 | Neya |

FOREIGN PATENT DOCUMENTS

| | | |
|---|---|---|
| CN | 107431075 A | 12/2017 |
| CN | 109983581 A | 7/2019 |
| CN | 110313067 A | 10/2019 |
| EP | 2133918 A2 | 12/2009 |
| EP | 3196617 A1 | 7/2017 |
| EP | 3552236 A1 | 10/2019 |
| FR | 3019379 A1 | 10/2015 |
| JP | 2007243093 A | 9/2007 |
| JP | 2010-114273 A | 5/2010 |
| JP | 2011-014751 A | 1/2011 |
| JP | 2011-159757 A | 8/2011 |
| JP | 2013-098446 A | 5/2013 |
| JP | 2016-187007 A | 10/2016 |
| JP | 2018-093126 A | 6/2018 |
| JP | 2018-148039 A | 9/2018 |
| JP | 2019-169668 A | 10/2019 |
| JP | 2020-077650 A | 5/2020 |
| KR | 10-2009-0127828 A | 12/2009 |
| KR | 10-2019-0089843 A | 7/2019 |
| KR | 10-2019-0119050 A | 10/2019 |
| TW | 201003907 A | 1/2010 |
| WO | 2013/065569 A1 | 5/2013 |
| WO | 2016/136486 A1 | 9/2016 |
| WO | 2018/105359 A1 | 6/2018 |
| WO | 2018/163732 A1 | 9/2018 |
| WO | WO-2019093479 A1 | 5/2019 |
| WO | 2019/188043 A1 | 10/2019 |
| WO | 2019/240207 A1 | 12/2019 |
| WO | 2020/095674 A1 | 5/2020 |

* cited by examiner

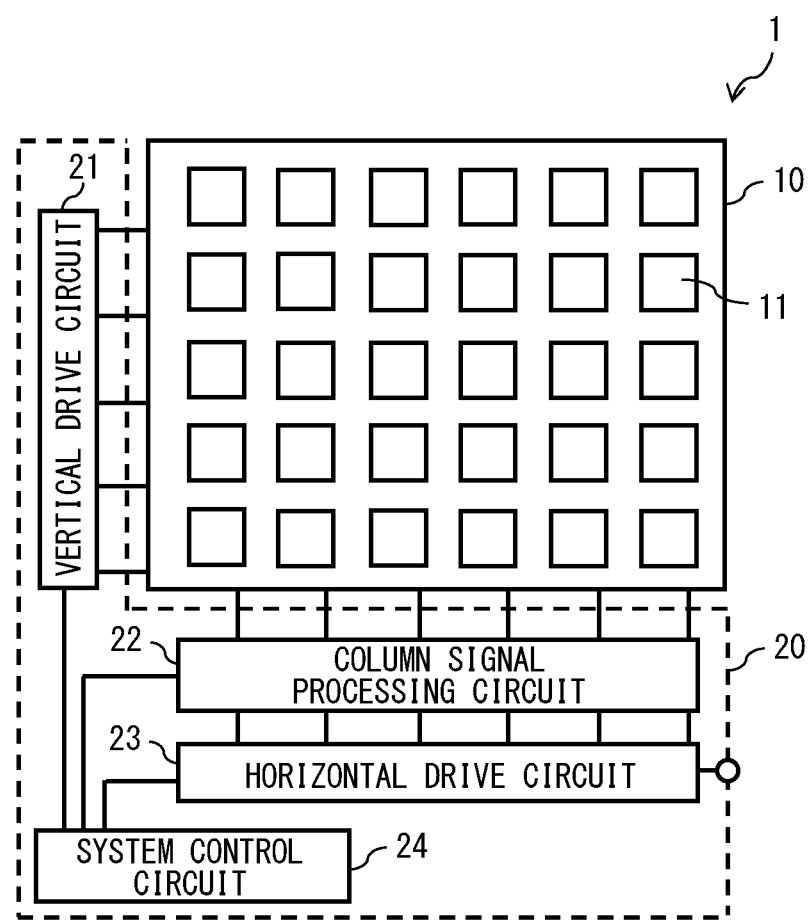
[FIG. 1]

[FIG. 2]
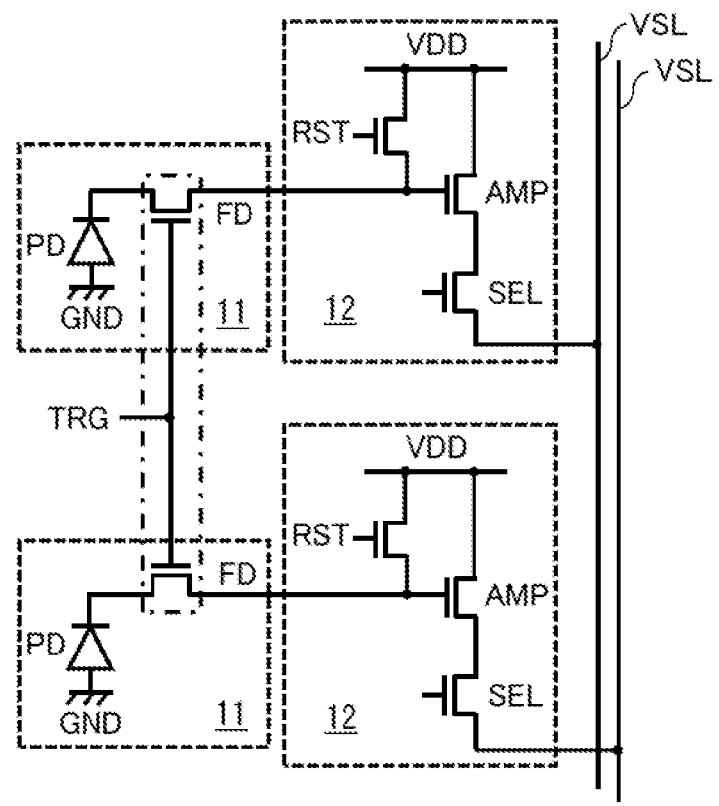

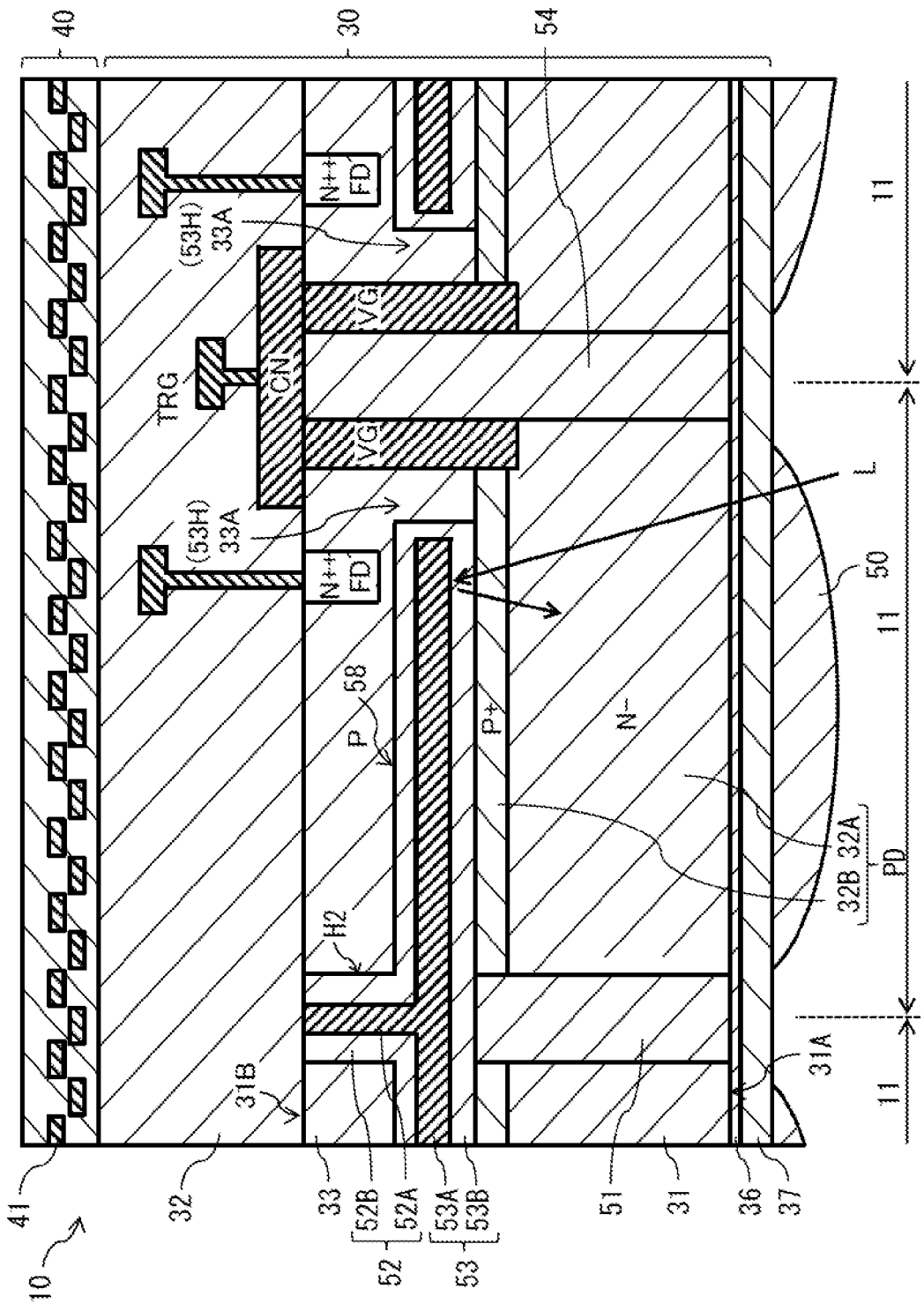
[FIG. 3]

[FIG. 4]
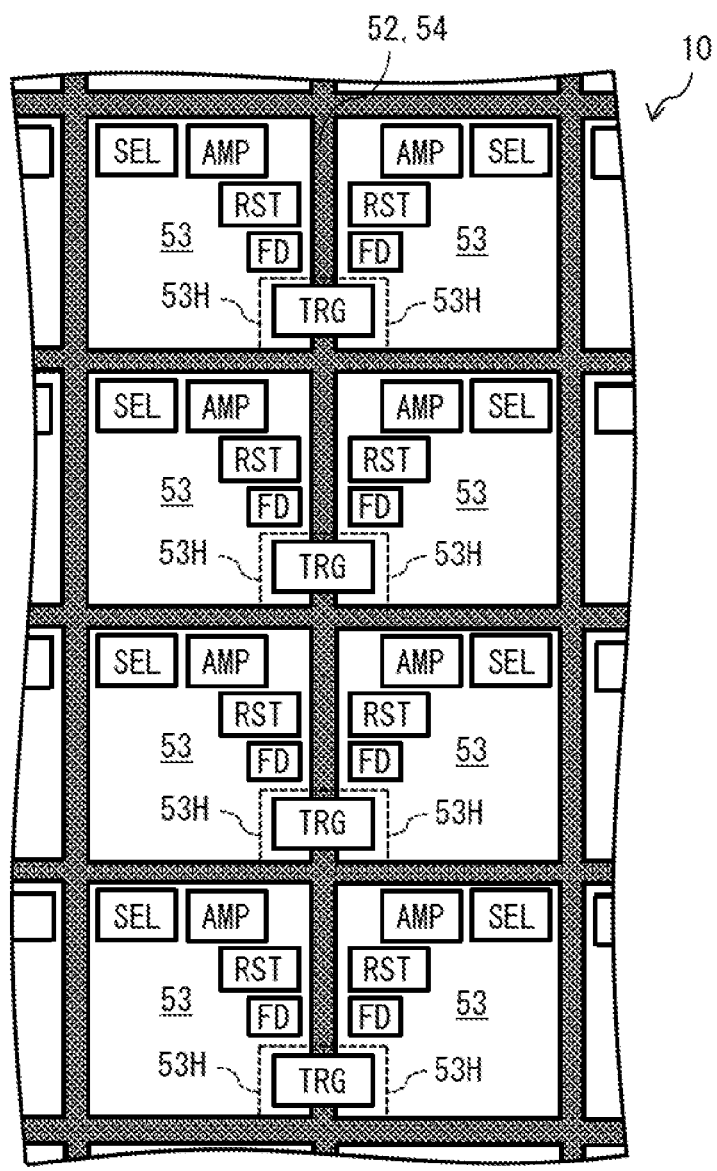

[FIG. 5]
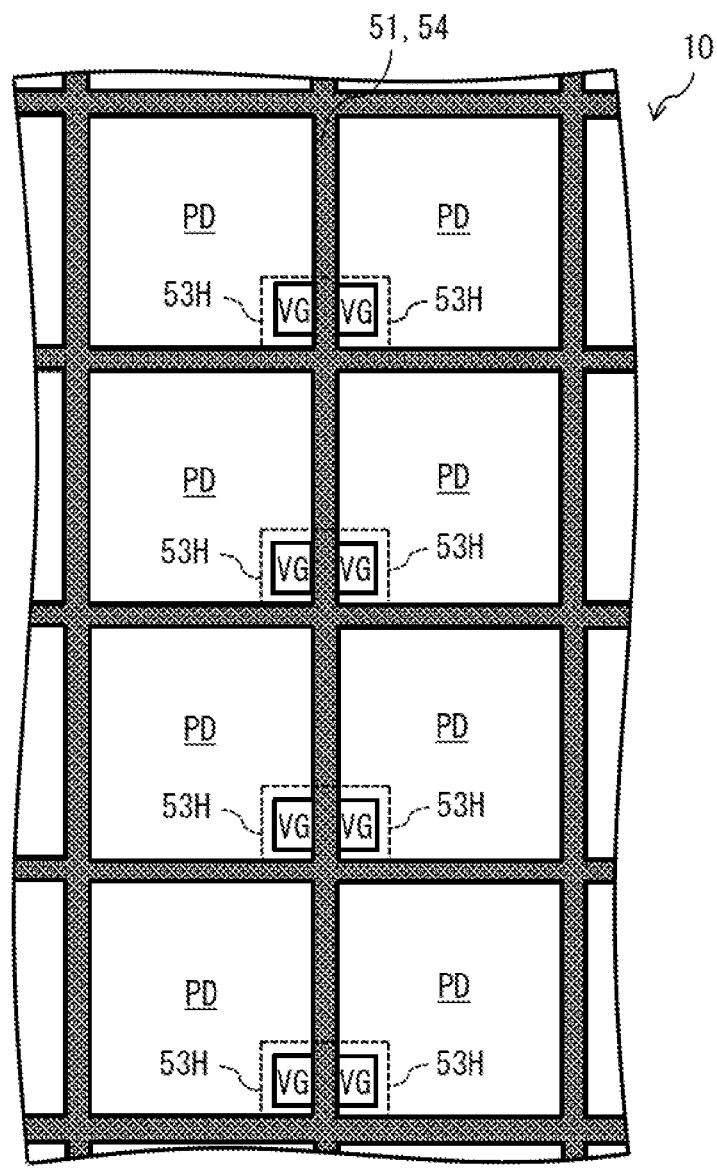

[FIG. 6]
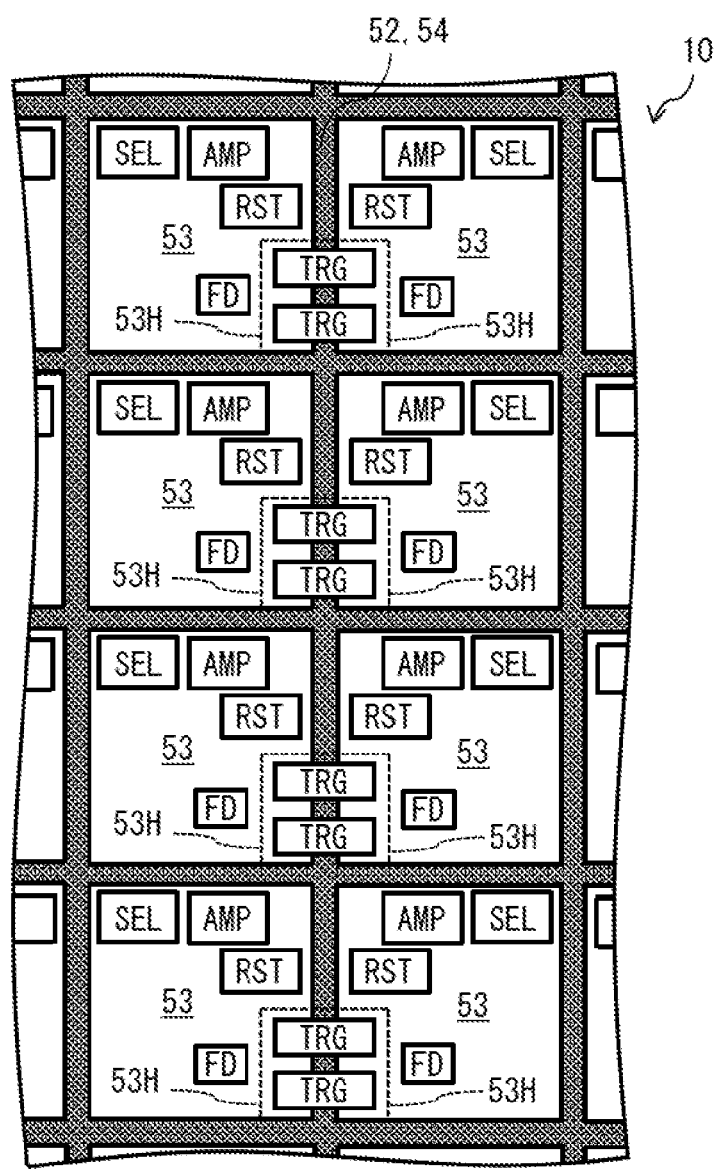

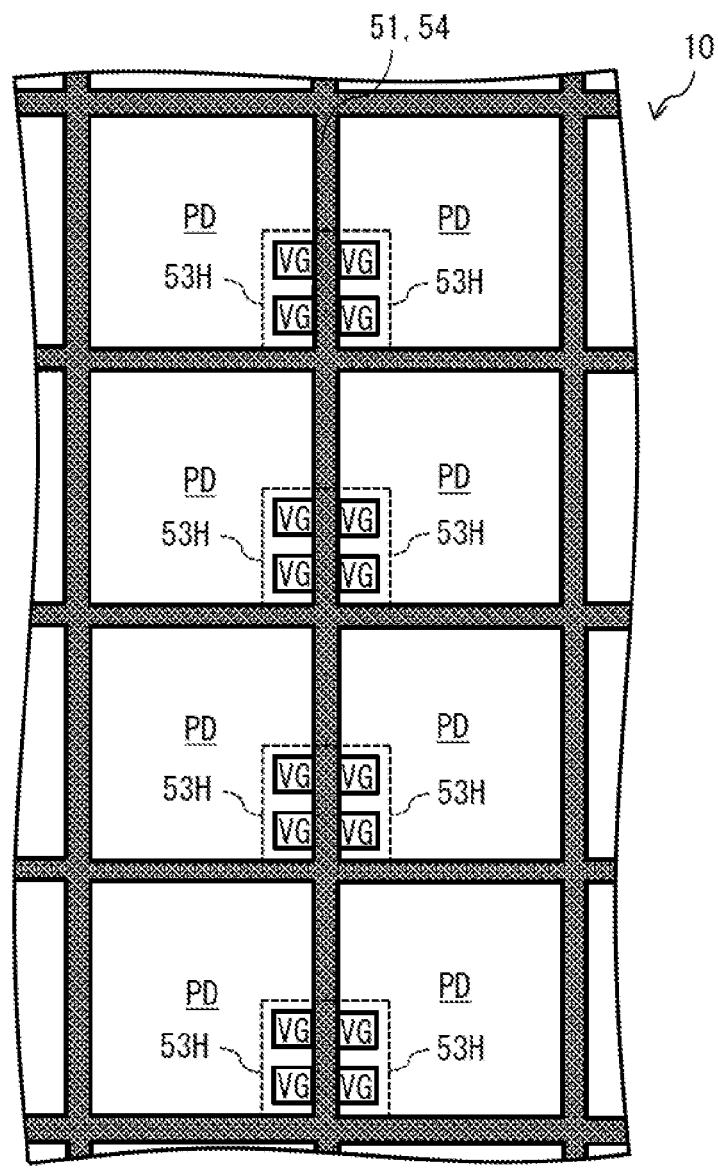
[FIG. 7]

[FIG. 8]
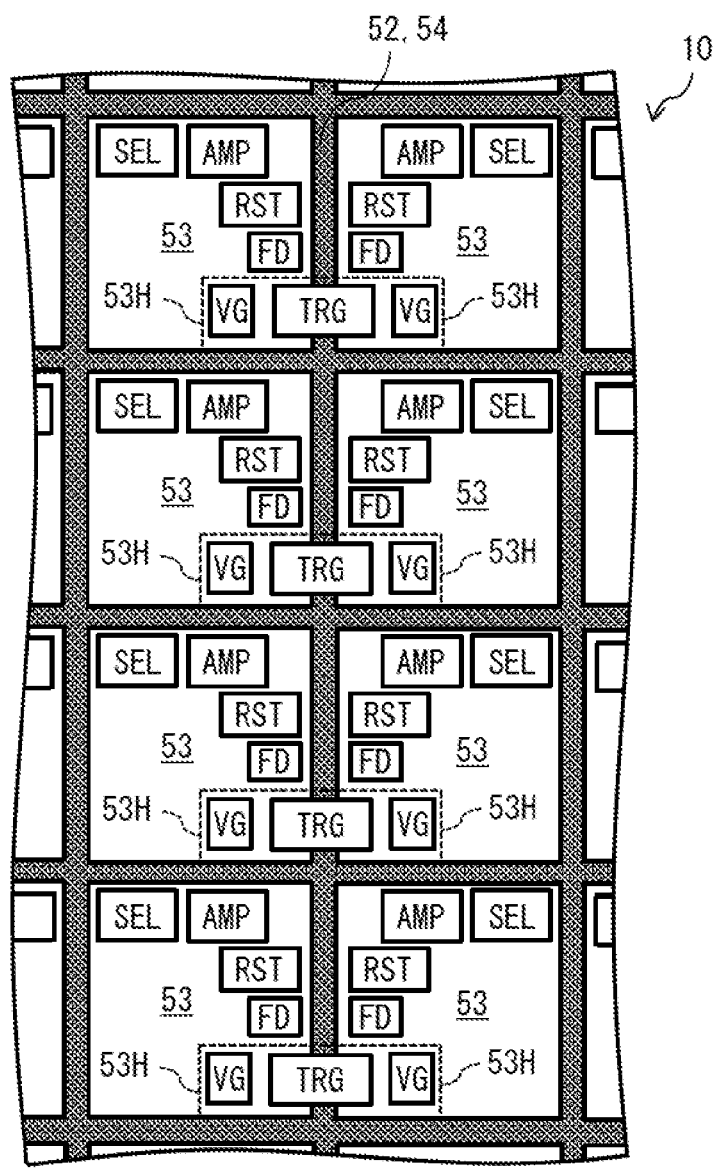

[FIG. 9]
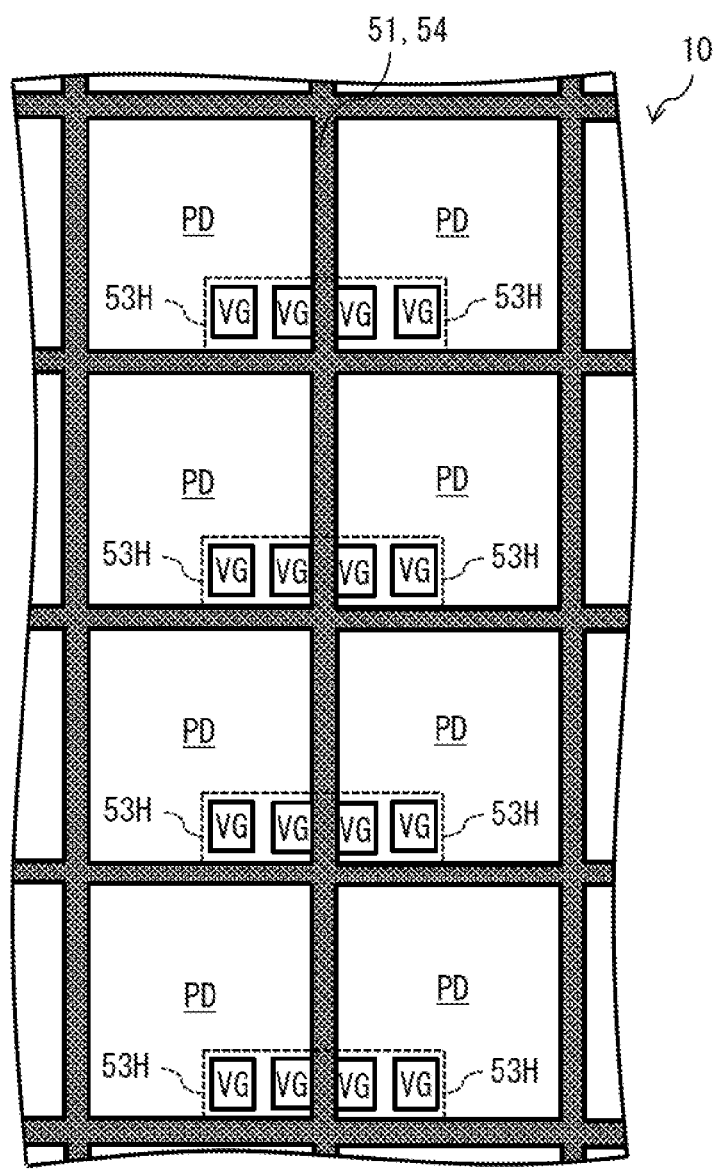

[FIG. 10]
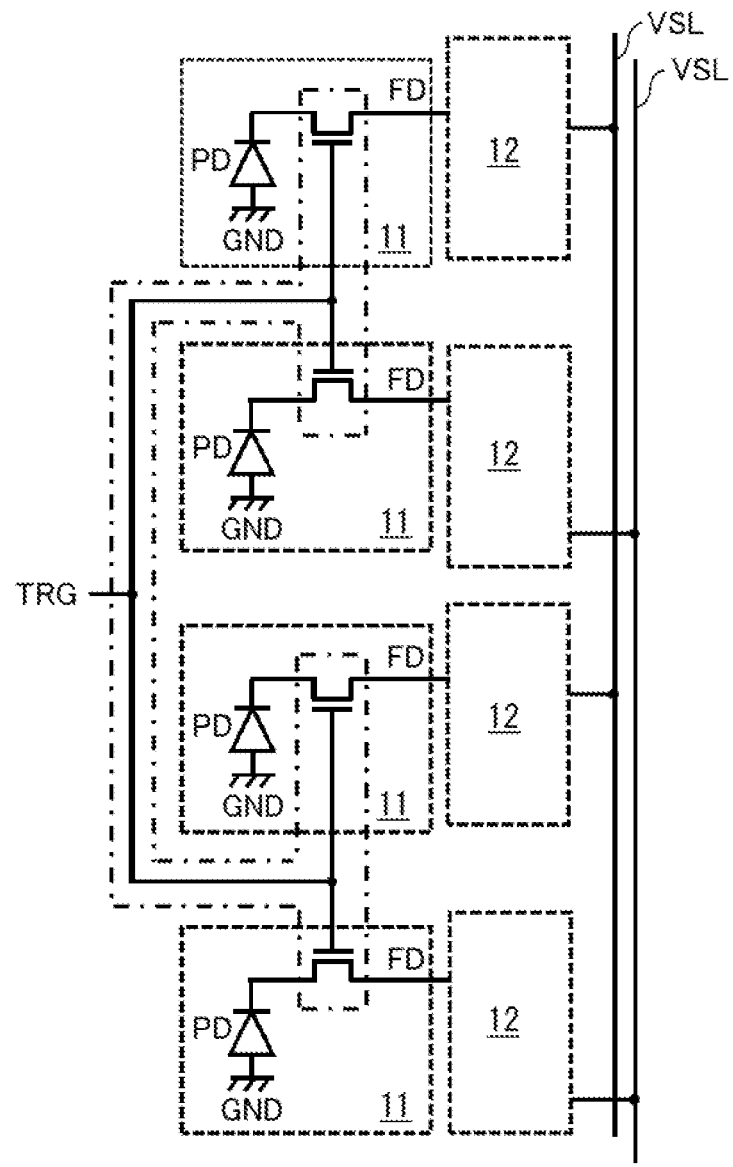

[FIG. 11]
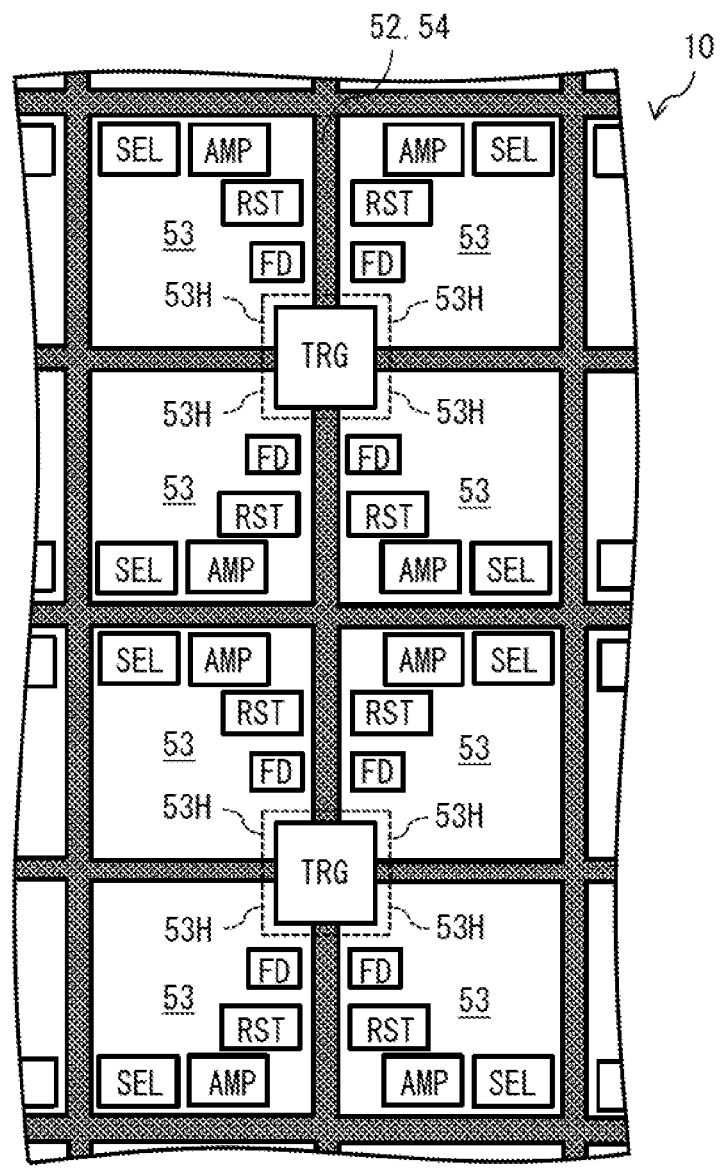

[FIG. 12]
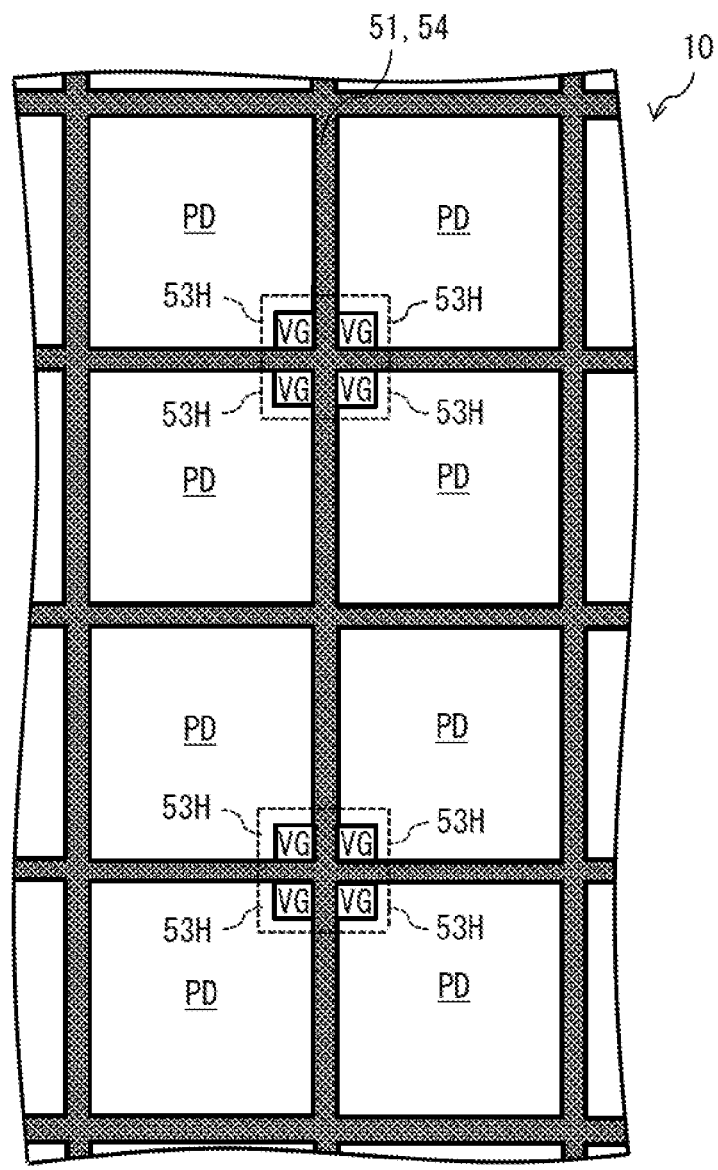

[FIG. 13]
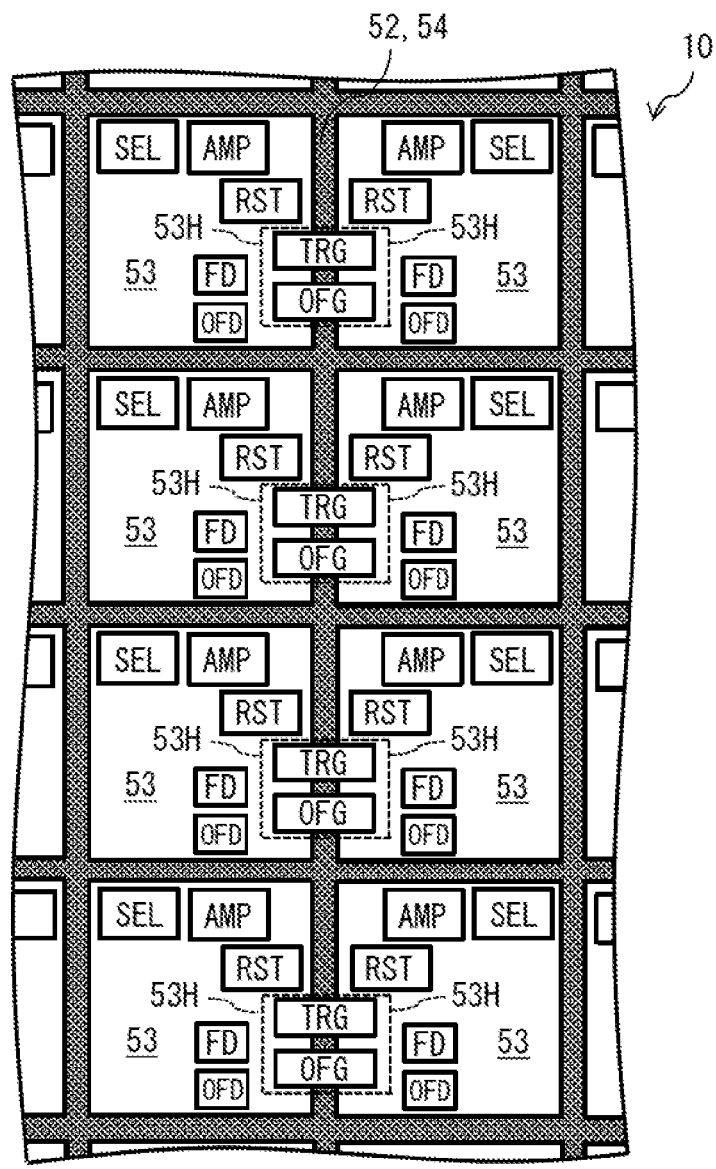

[FIG. 14]
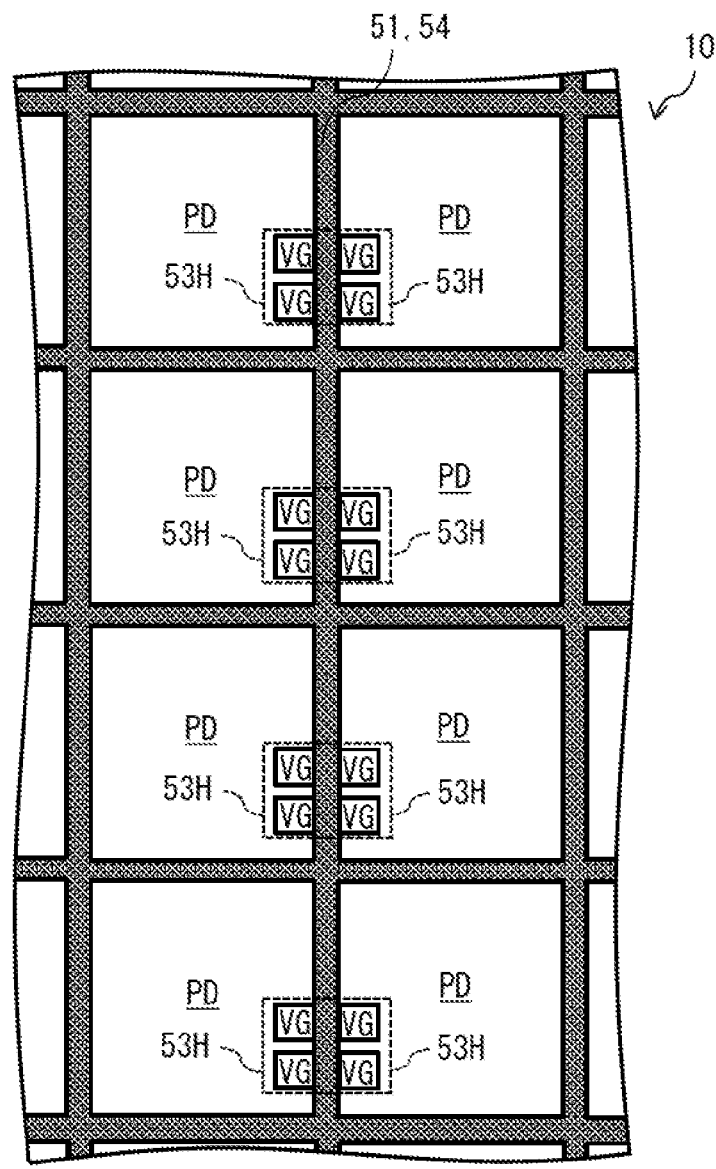

[FIG. 15]
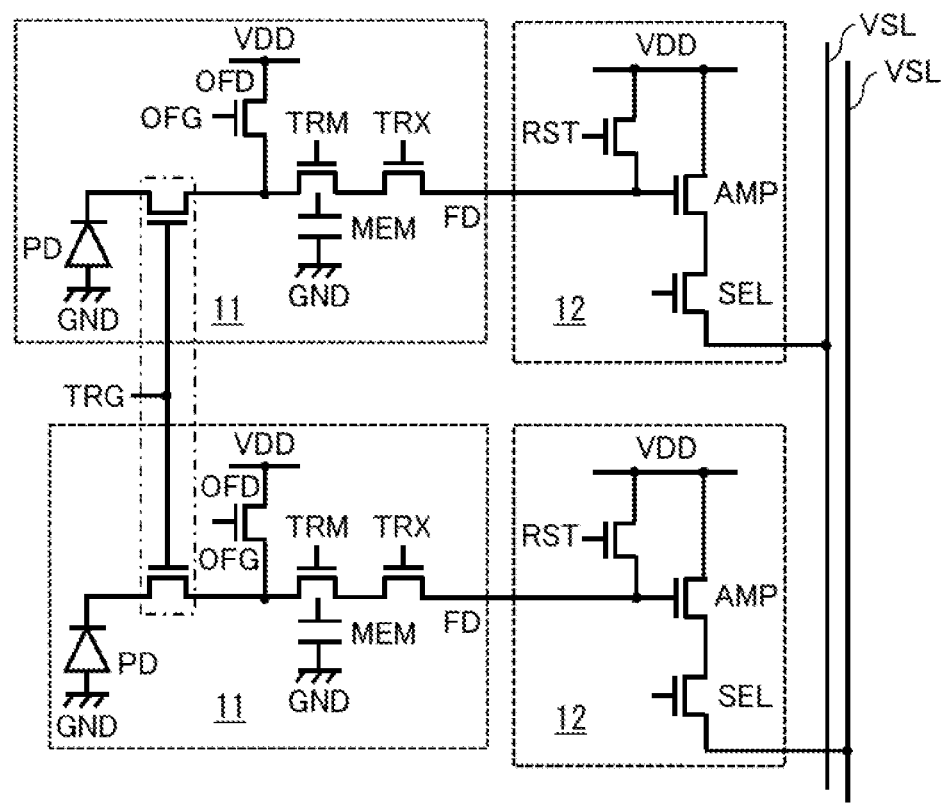

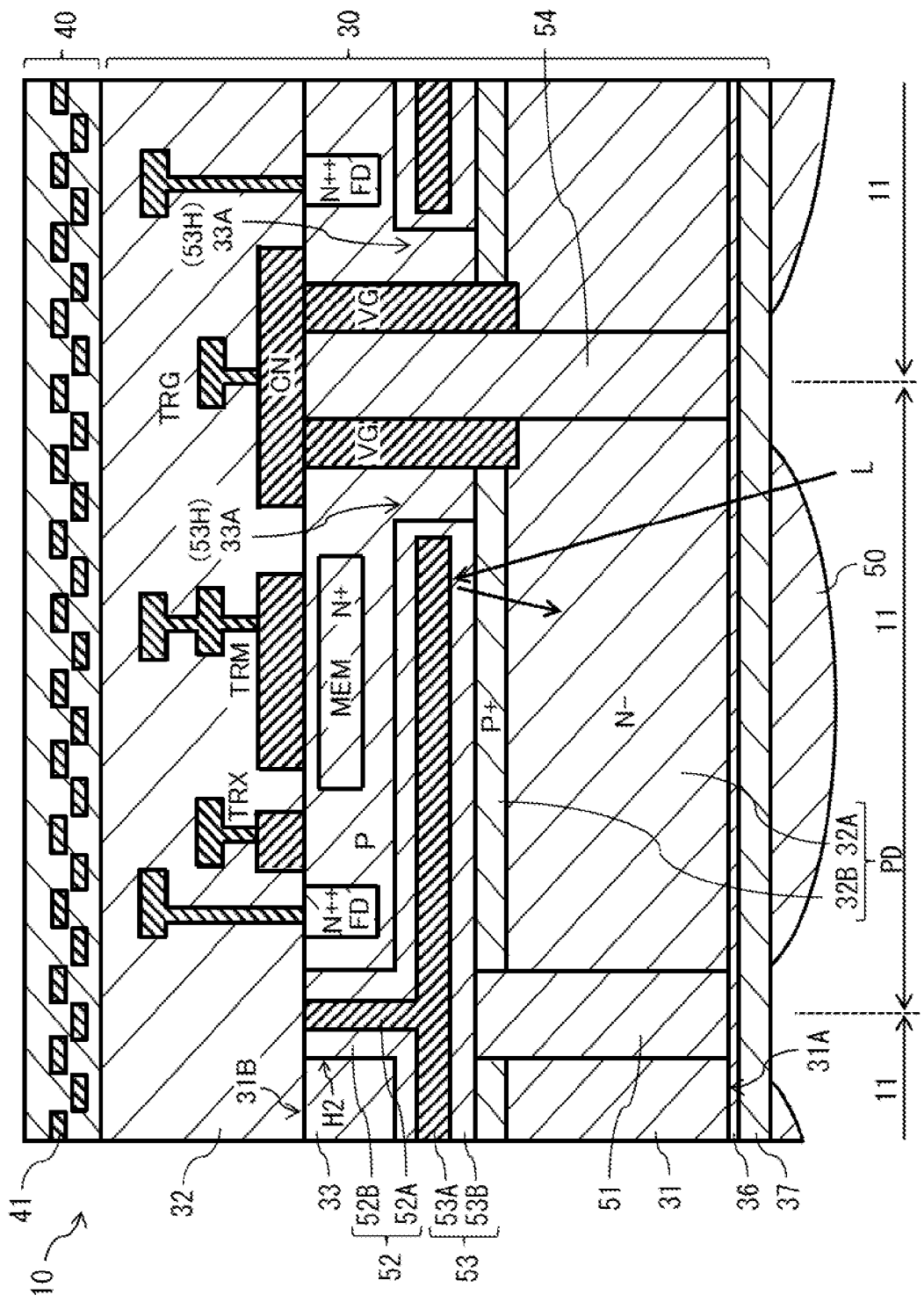
[FIG. 16]

[FIG. 17]
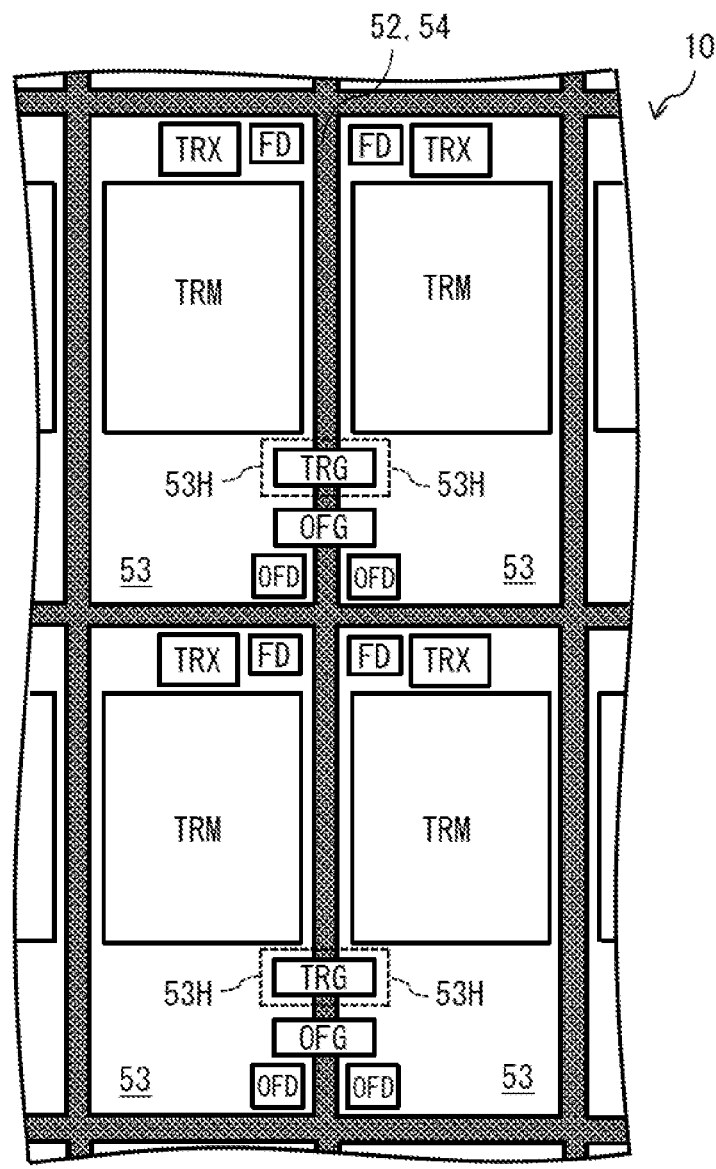

[FIG. 18]
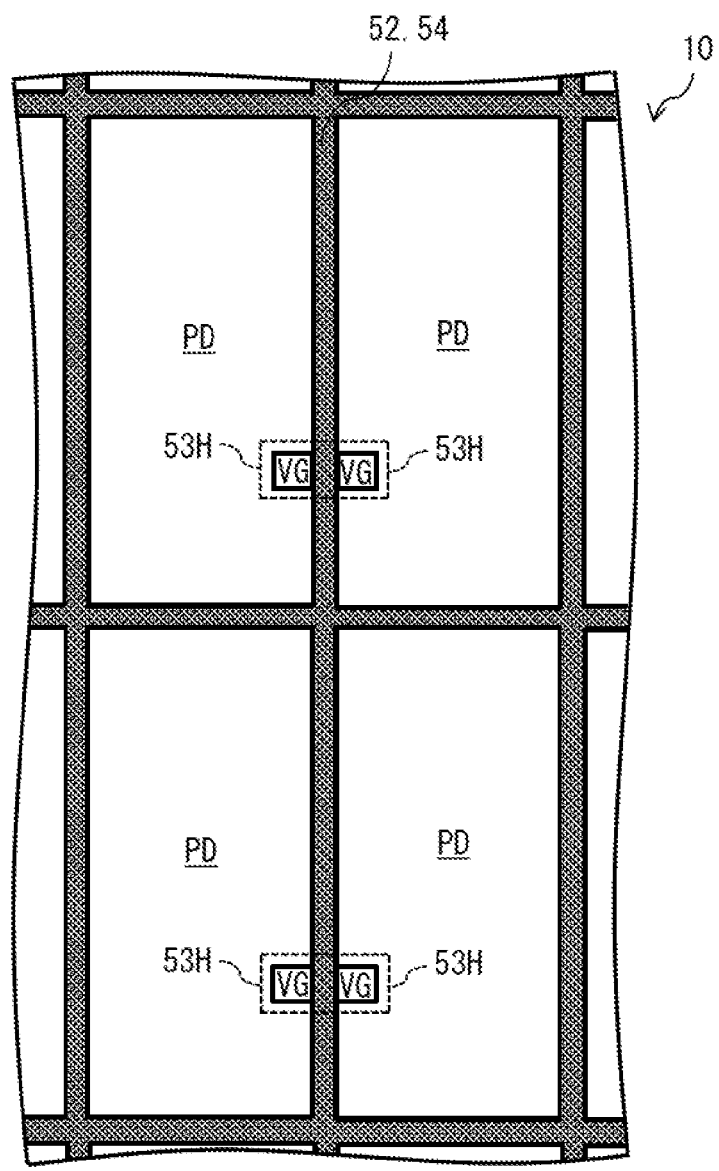

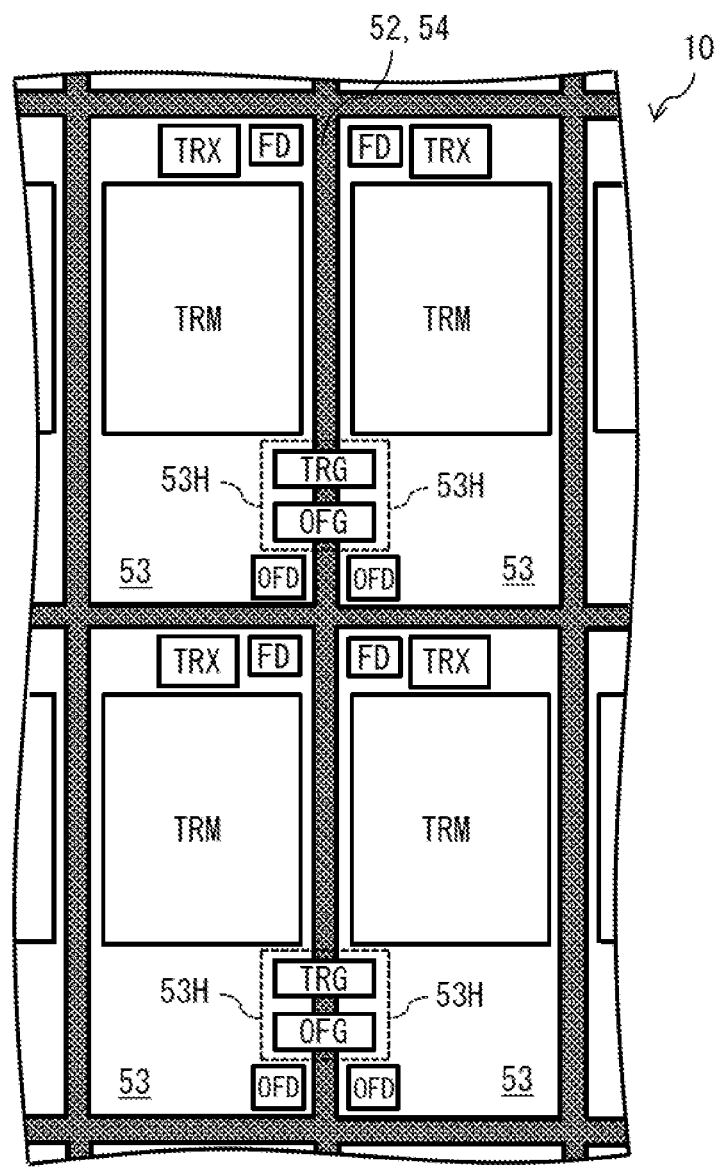
[FIG. 19]

[FIG. 20]
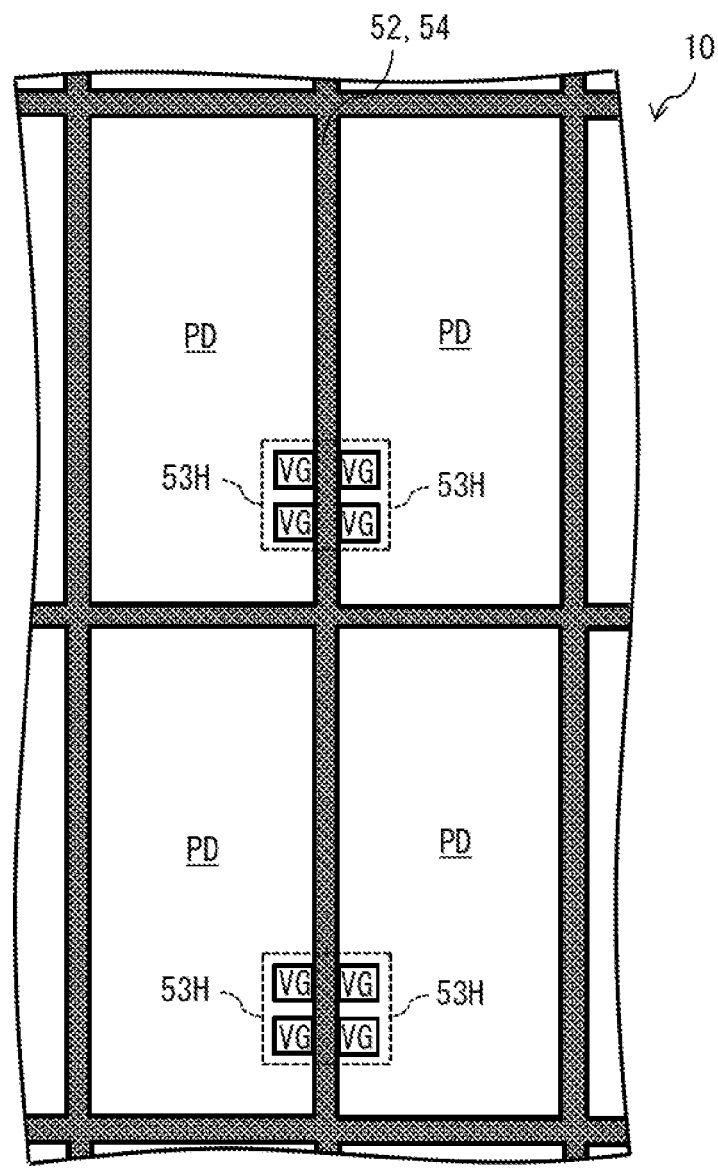

[FIG. 21]
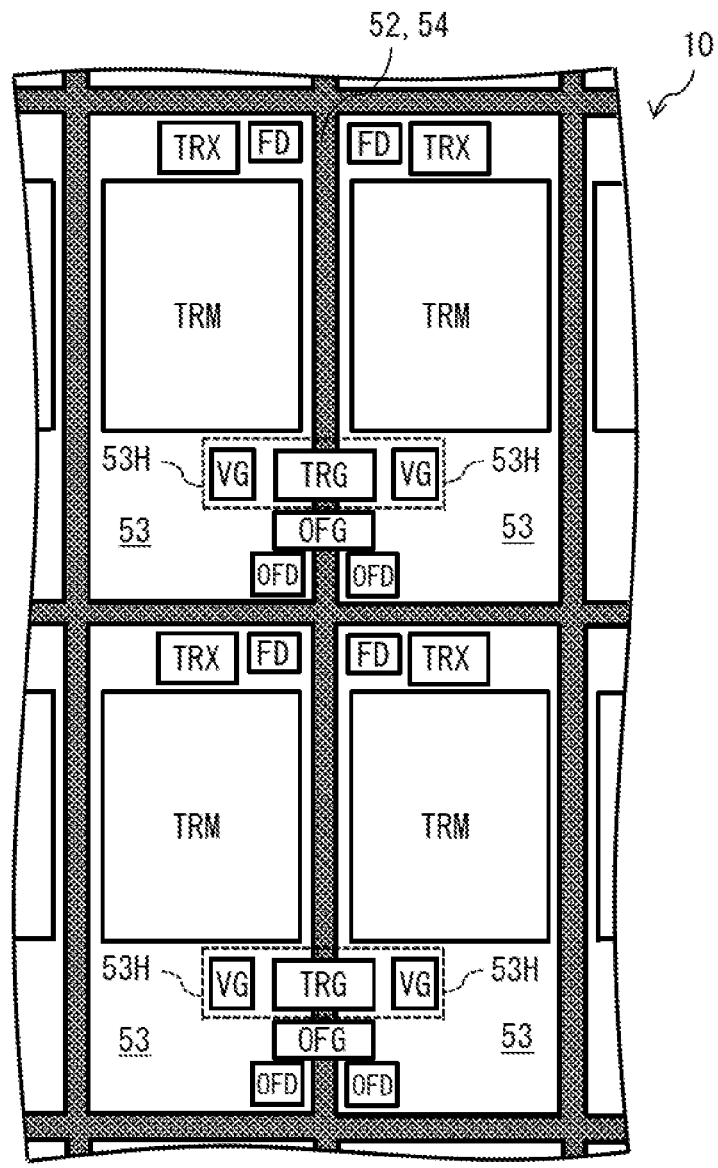

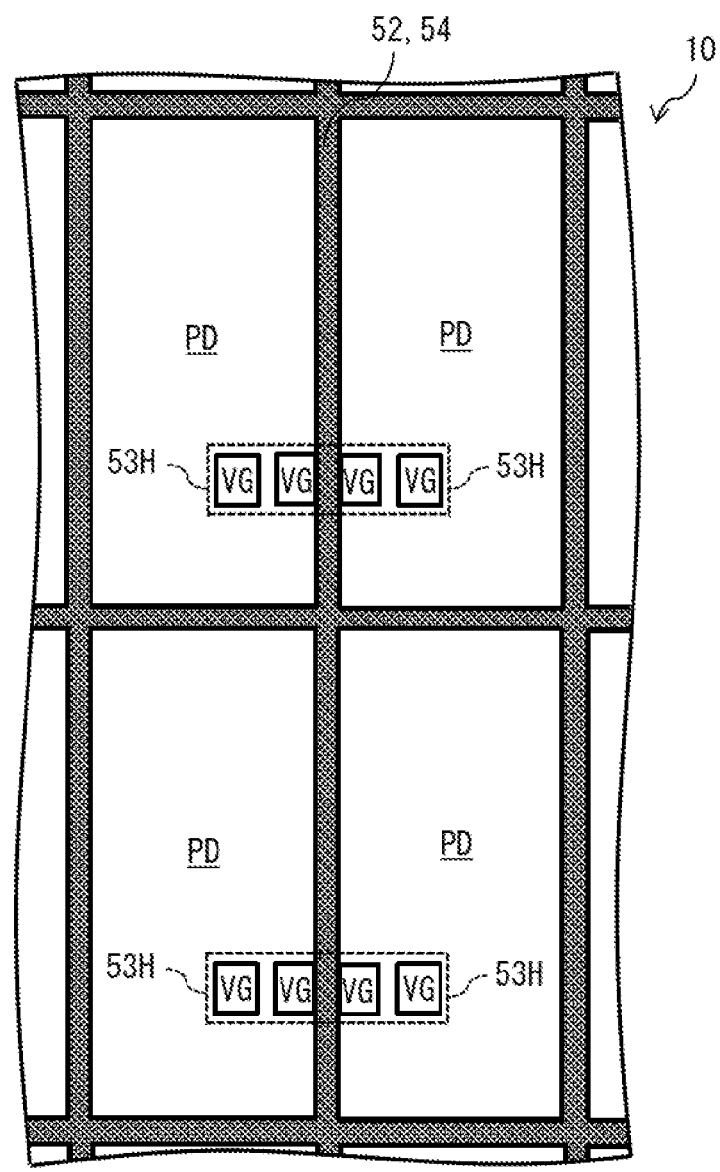
[FIG. 22]

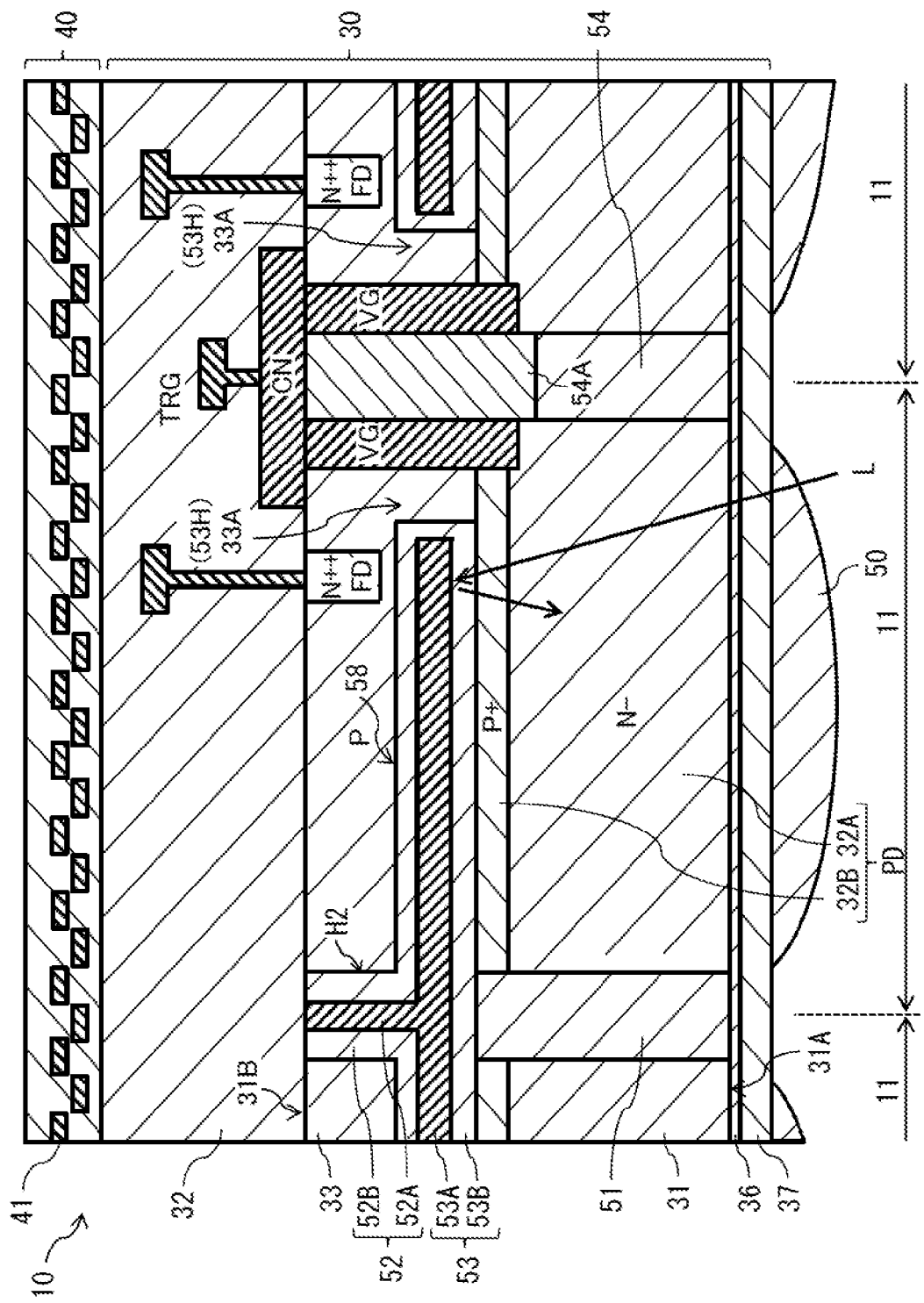
[FIG. 23]

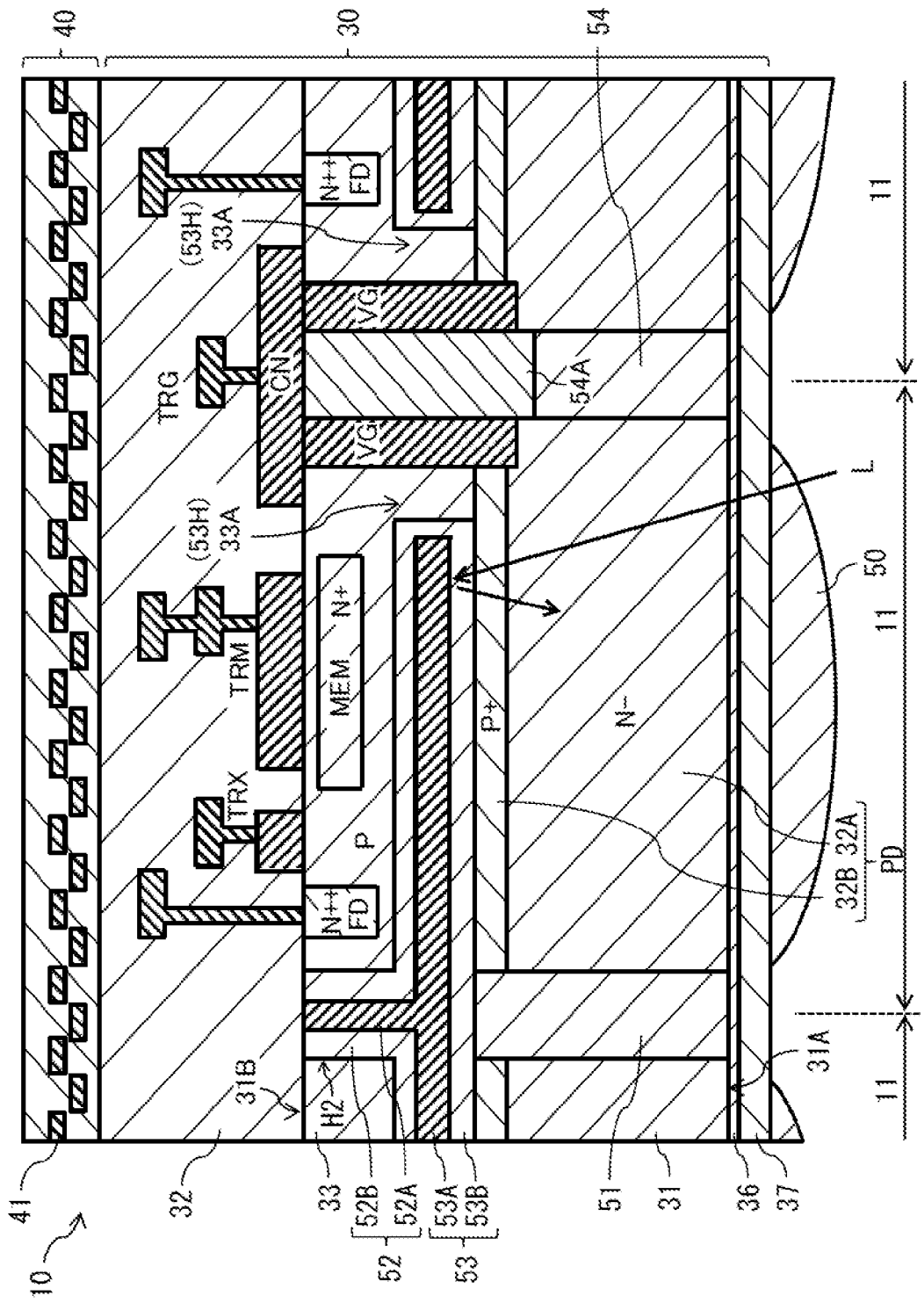

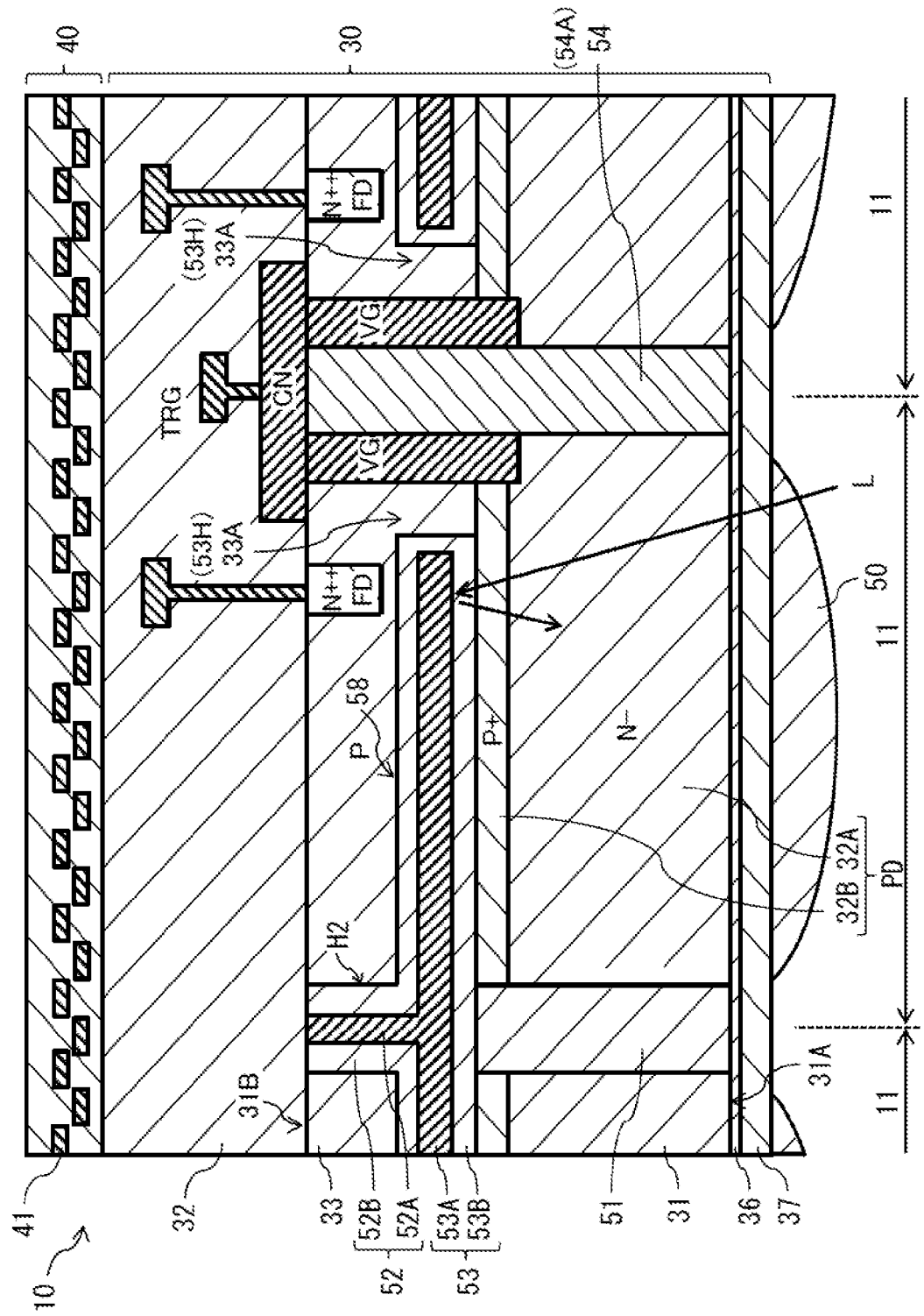
[FIG. 25]

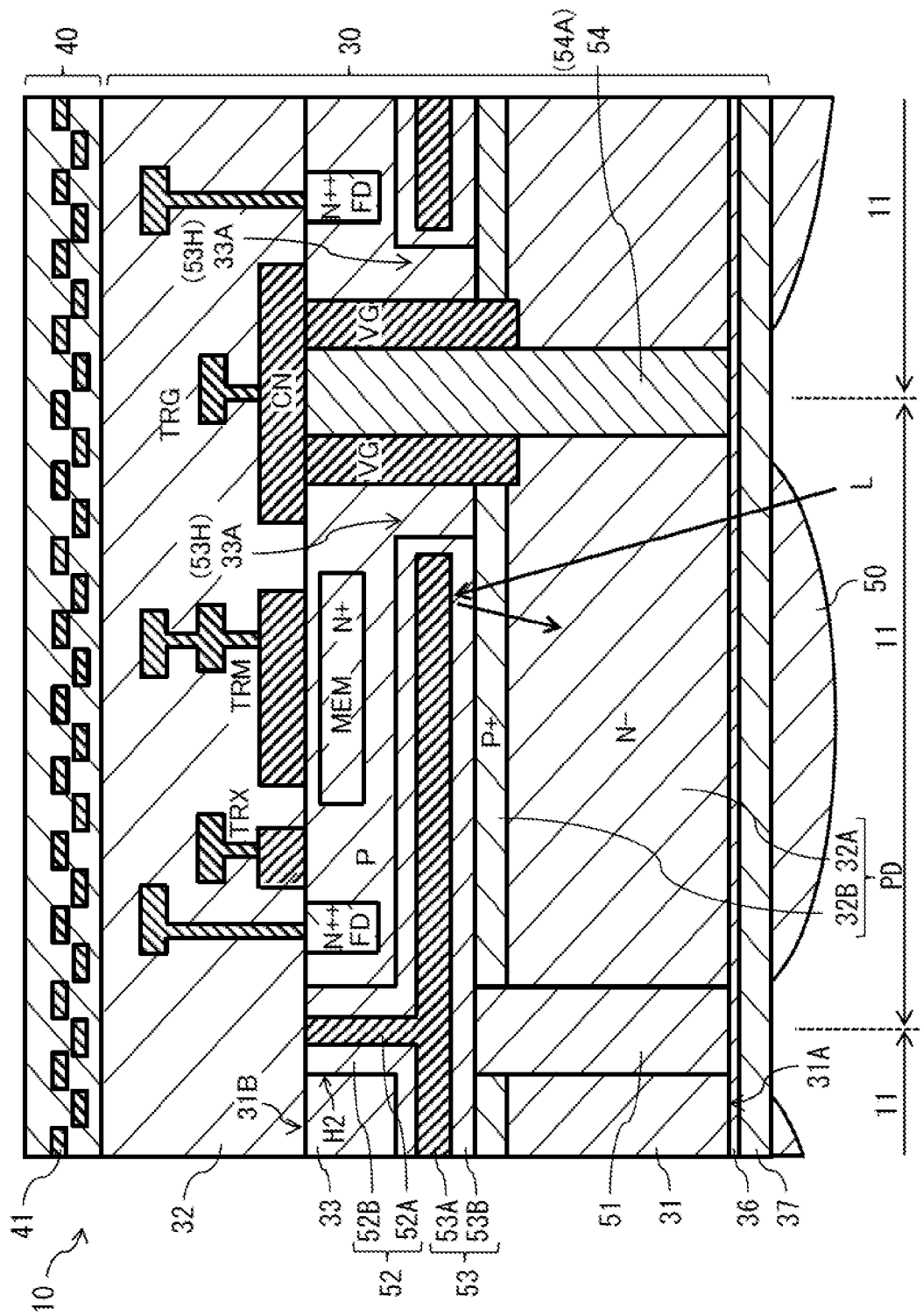
[FIG. 26]

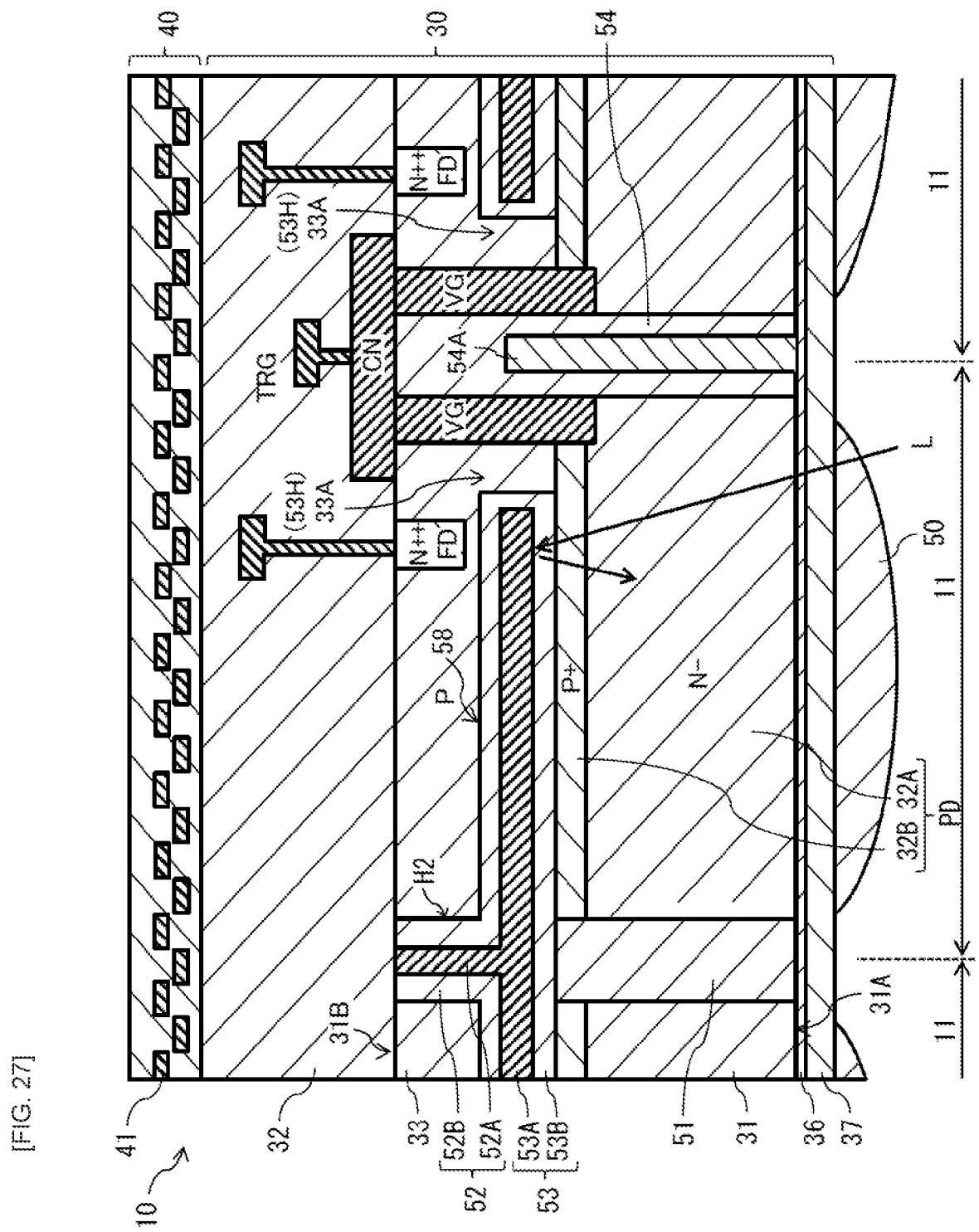
[FIG. 27]

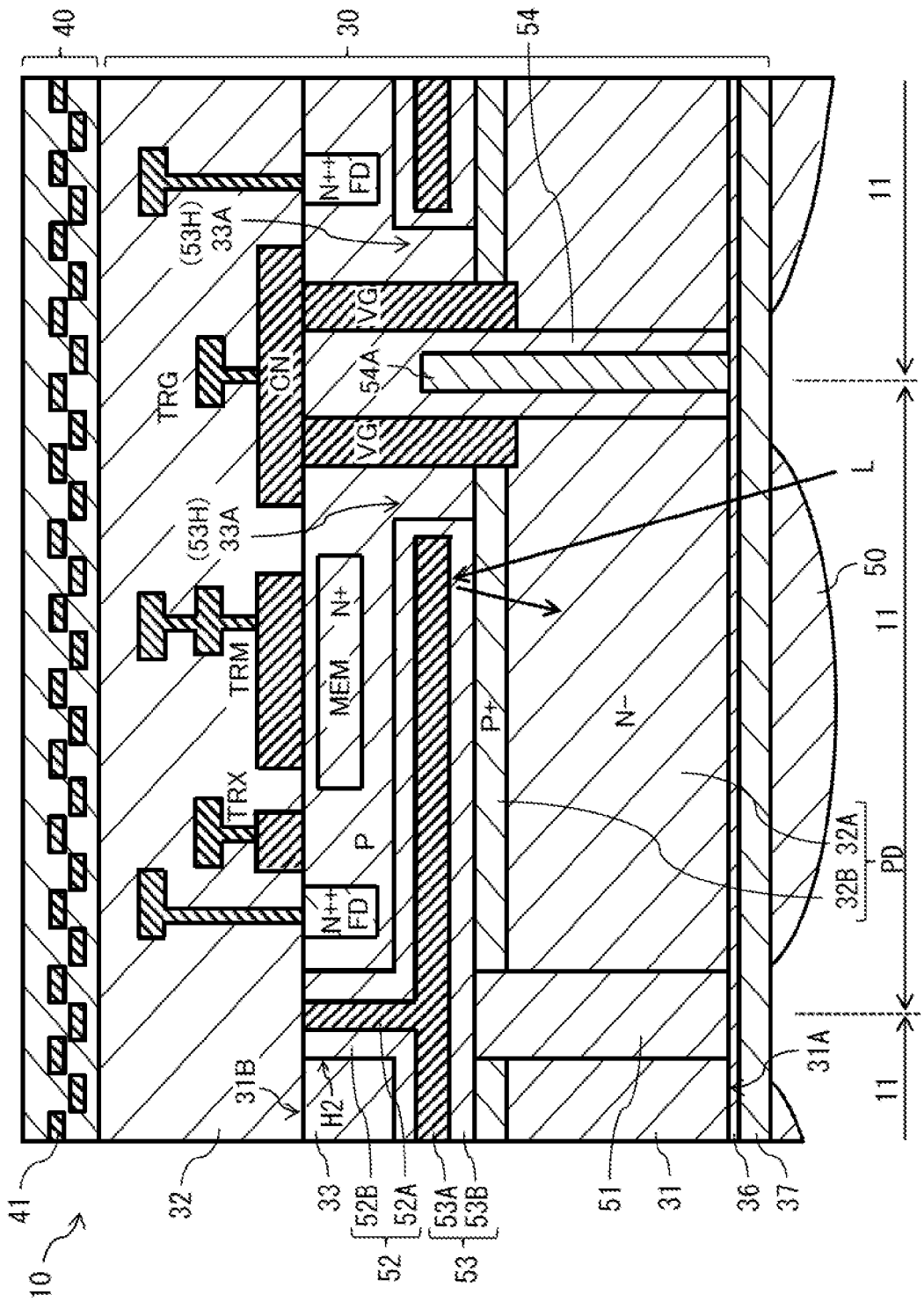
[FIG. 28]

[FIG. 29]
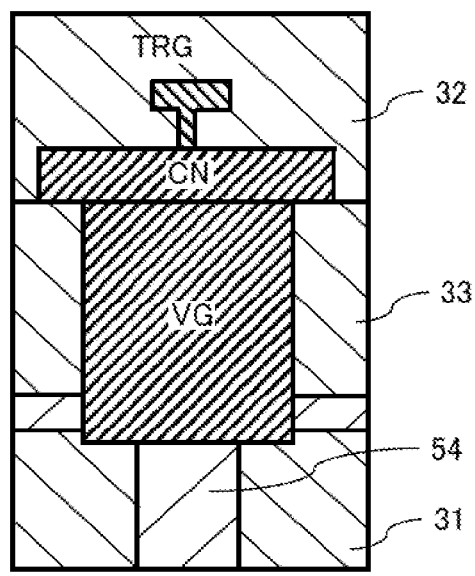

[FIG. 30]
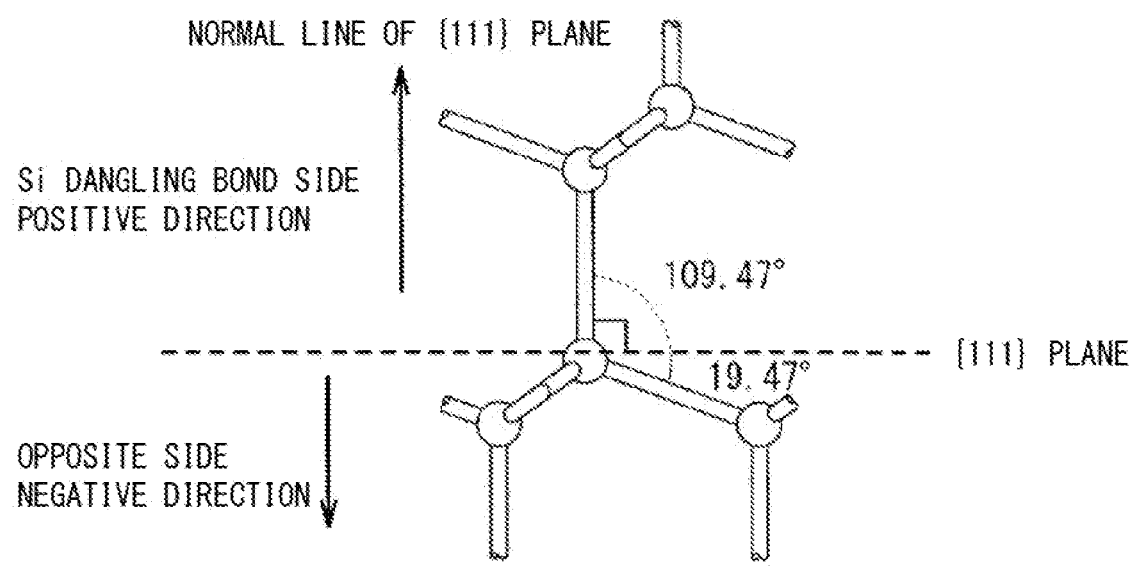

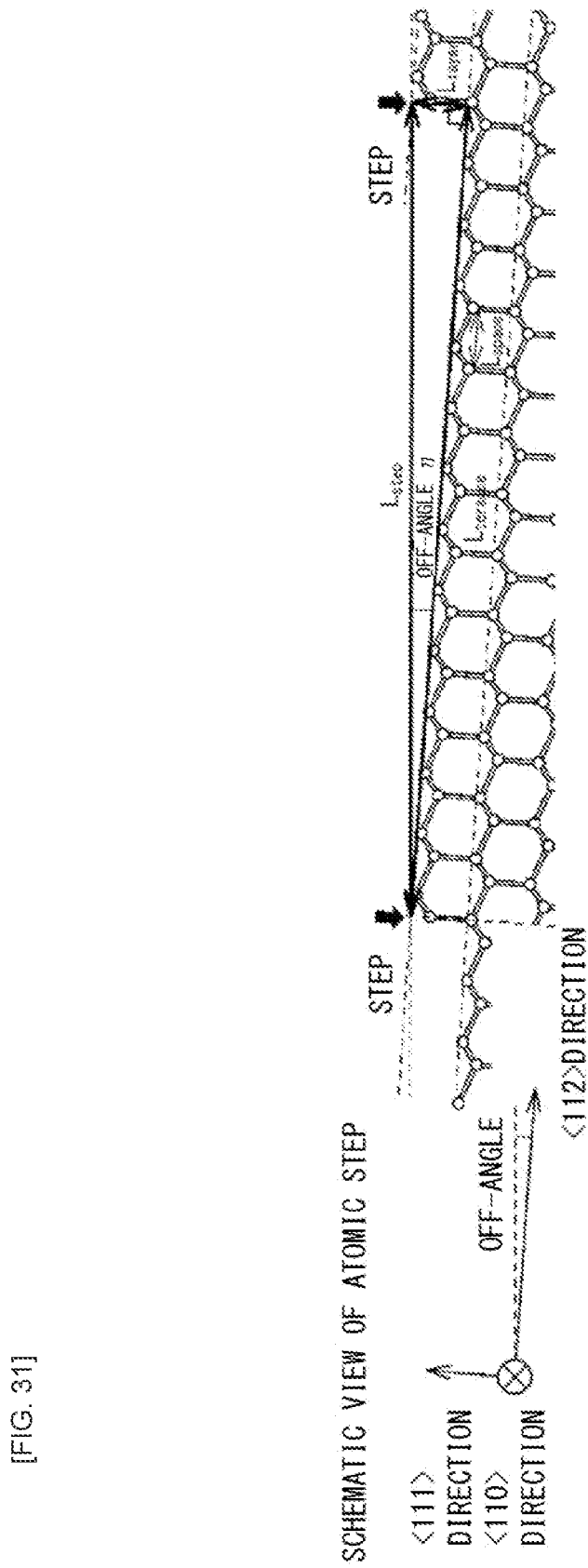
[FIG. 31]

[FIG. 32]
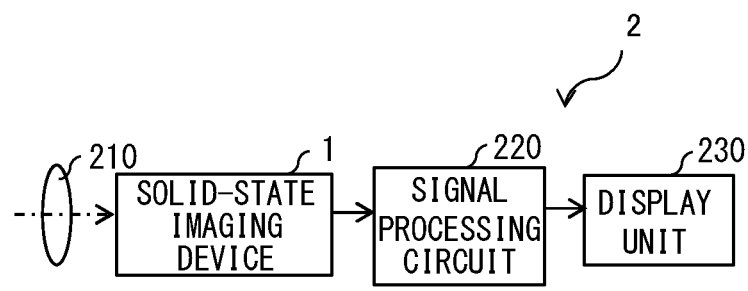

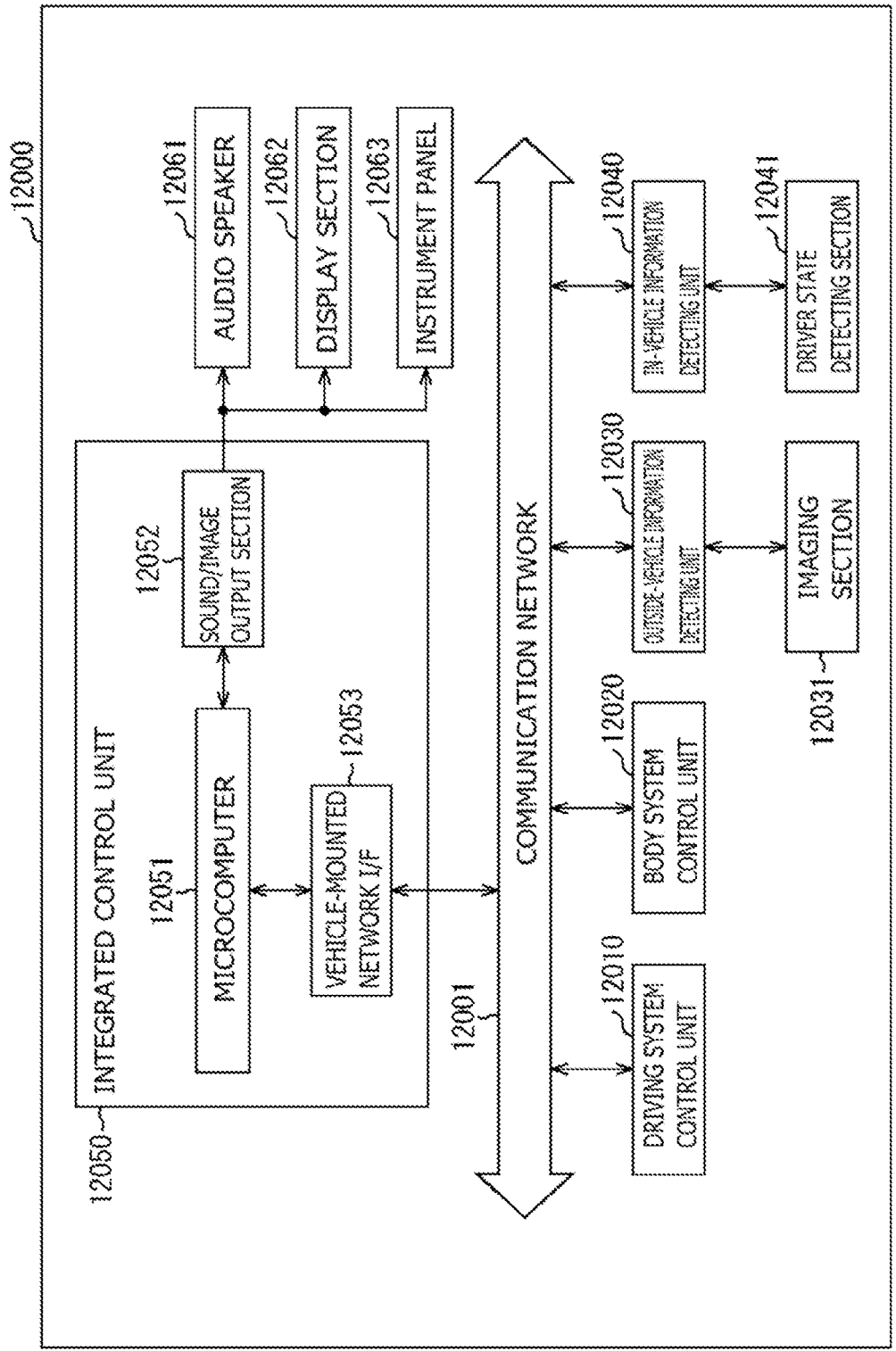
[FIG. 33]

[FIG. 34]
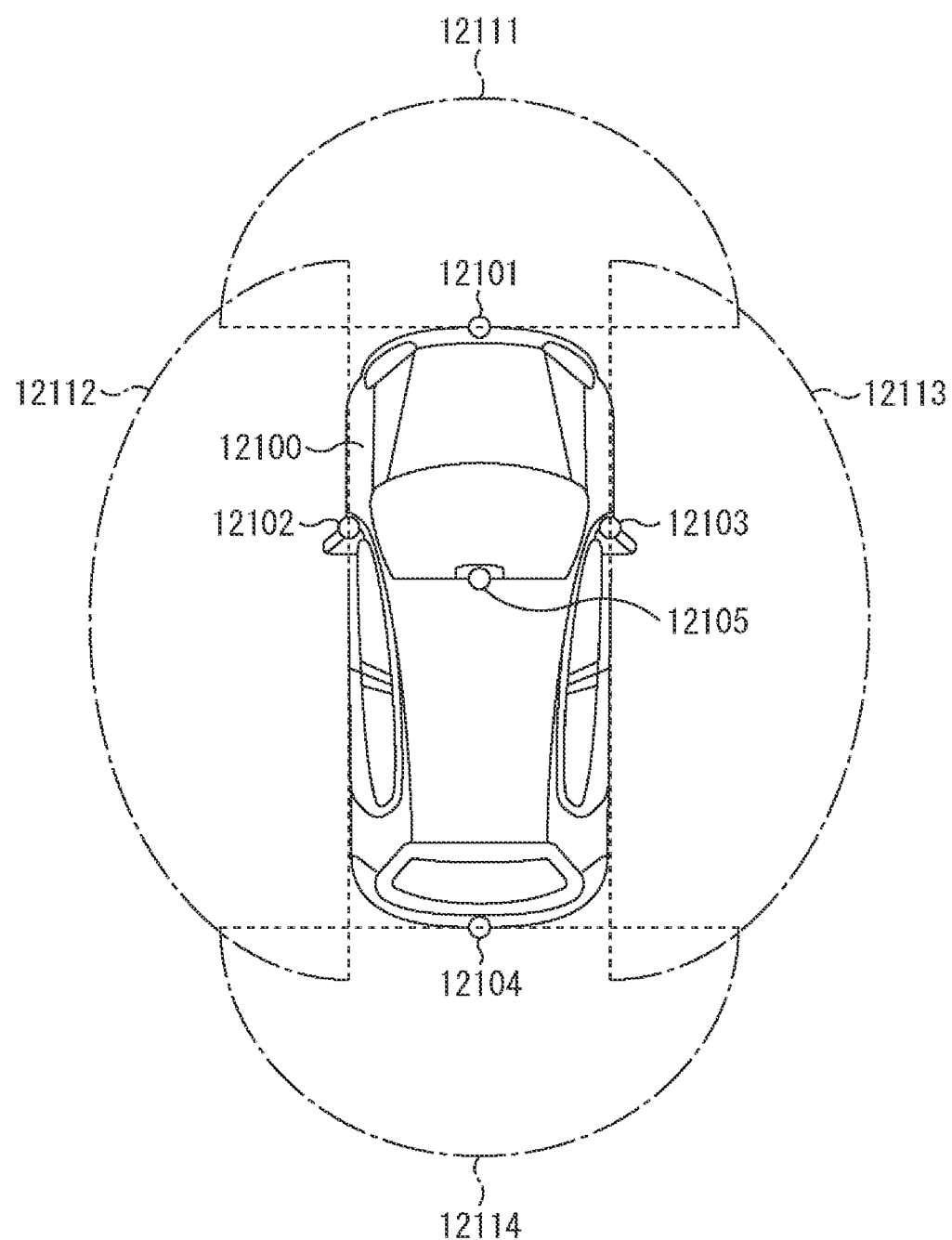

SOLID-STATE IMAGING DEVICE AND ELECTRONIC APPARATUS

CROSS REFERENCE TO RELATED APPLICATIONS

This application is a U.S. National Phase of International Patent Application No. PCT/JP2020/042691 filed on Nov. 17, 2020, which claims priority benefit of Japanese Patent Application No. JP 2019-207923 filed in the Japan Patent Office on Nov. 18, 2019. Each of the above-referenced applications is hereby incorporated herein by reference in its entirety.

TECHNICAL FIELD

The present disclosure relates to a solid-state imaging device and an electronic apparatus.

BACKGROUND ART

A global shutter method using a CMOS image sensor has been known (e.g., see PTL 1) in a solid-state imaging device. In the invention described in PTL 1 above, by providing a charge-holding section to which charges accumulated in a photoelectric conversion section is transferred at a depth different from the photoelectric conversion section, it is possible to secure the number of saturated electrons while securing an area of the photoelectric conversion section.

CITATION LIST

Patent Literature

PTL 1: Japanese Unexamined Patent Application Publication No. 2010-114273

SUMMARY OF THE INVENTION

However, in the invention described above in PTL 1, there is a possibility that noise may be generated due to incidence of light on a charge-holding section. In order to reduce the noise, it is conceivable to provide a light-blocking layer. In a case where the light-blocking layer is provided, charge transfer from a photoelectric conversion section to the charge-holding section becomes difficult. In order to facilitate the charge transfer, it is conceivable to provide a vertical gate electrode reaching the photoelectric conversion section from an opening provided in the light-blocking layer. In a case where the vertical gate electrode is provided, pixel size is increased, and, moreover, noise is increased, which is caused by the light incidence on the charge-holding section from the opening provided in the light-blocking layer. It is therefore desirable to provide a solid-state imaging device that makes it possible to avoid deterioration of charge transfer while suppressing an increase in noise and pixel size, and an electronic apparatus including the solid-state imaging device.

A first solid-state imaging device according to an embodiment of the present disclosure includes a light-receiving surface, a plurality of pixels each including a photoelectric conversion section that photoelectrically converts light incident through the light-receiving surface, and a separation section that electrically and optically separates each photoelectric conversion section. Each of the pixels includes a charge-holding section that holds charges transferred from the photoelectric conversion section, a transfer transistor that includes a vertical gate electrode reaching the photoelectric conversion section, and transfers charges from the photoelectric conversion section to the charge-holding section, and a light-blocking section disposed in a layer between the photoelectric conversion section and the charge-holding section. A plurality of the vertical gate electrodes are electrically coupled together in a plurality of first pixels adjacent to each other among the plurality of pixels.

A first electronic apparatus according to an embodiment of the present disclosure includes a solid-state imaging device that outputs a pixel signal corresponding to incident light, and a signal processing circuit that processes the pixel signal. The solid-state imaging device provided in the first electronic apparatus has the same configuration as that of the first solid-state imaging device described above.

In the first solid-state imaging device and the first electronic apparatus according to respective embodiments of the present disclosure, the vertical gate electrode reaching the photoelectric conversion section is provided. This makes it possible to avoid deterioration of the charge transfer from the photoelectric conversion section to the charge-holding section caused by provision of the light-blocking section. Further, in the present disclosure, a plurality of the vertical gate electrodes are electrically coupled together in a plurality of first pixels adjacent to each other among the plurality of pixels. This makes it possible to reduce the size of the transfer transistor, as compared with a case where the transfer transistors are provided separately for the respective pixels; accordingly, it is possible to reduce the size of the opening, of the light-blocking section, through which the vertical gate electrode penetrates. As a result, it is possible to suppress an increase in noise and pixel size.

A second solid-state imaging device according to an embodiment of the present disclosure includes a light-receiving surface, a plurality of pixels each including a photoelectric conversion section that photoelectrically converts light incident through the light-receiving surface, and a separation section that electrically and optically separates each photoelectric conversion section. Each of the pixels includes a charge-holding section that holds charges transferred from the photoelectric conversion section, a transfer transistor that includes a first vertical gate electrode reaching the photoelectric conversion section, and transfers charges from the photoelectric conversion section to the charge-holding section, a discharge transistor that includes a second vertical gate electrode reaching the photoelectric conversion section, is disposed to be adjacent to the transfer transistor, and charges from the photoelectric conversion section, and a light-blocking section disposed in a layer between the photoelectric conversion section and the charge-holding section. A plurality of the vertical gate electrodes are electrically coupled together in a plurality of first pixels adjacent to each other among the plurality of pixels.

A second electronic apparatus according to an embodiment of the present disclosure includes a solid-state imaging device that outputs a pixel signal corresponding to incident light, and a signal processing circuit that processes the pixel signal. The solid-state imaging device provided in the second electronic apparatus has the same configuration as that of the second solid-state imaging device described above.

In the second solid-state imaging device and the second electronic apparatus according to respective embodiments of the present disclosure, the first and second vertical gate electrodes each reaching the photoelectric conversion section is provided. This makes it possible to avoid deterioration of the charge transfer from the photoelectric conversion section to the charge-holding section caused by provision of the light-blocking section. Further, in the present disclosure, a plurality of the first vertical gate electrodes are electrically coupled together, and a plurality of the second vertical gate electrodes are electrically coupled together, in a plurality of first pixels adjacent to each other among the plurality of pixels. This makes it possible to reduce the sizes of first and second transfer transistors, as compared with the case where the first and second transfer transistors are provided for each pixel separately; accordingly, it is possible to reduce the size of the opening, of the light-blocking section, through which the first and second vertical gate electrodes penetrate. As a result, it is possible to suppress an increase in noise and pixel size.

BRIEF DESCRIPTION OF THE DRAWINGS

FIG. 1 illustrates an example of an outline configuration of a solid-state imaging device according to an embodiment of the present disclosure.

FIG. 2 illustrates an example of a circuit configuration of a pixel array section in FIG. 1.

FIG. 3 illustrates an example of a cross-sectional configuration of the pixel array section in FIG. 1.

FIG. 4 illustrates an example of a planar configuration of the pixel array section in FIG. 3 on side of a logic circuit.

FIG. 5 illustrates an example of a planar configuration of the pixel array section in FIG. 3 on side of a light-receiving surface.

FIG. 6 illustrates a modification example of the planar configuration of the pixel array section in FIG. 3 on the side of the logic circuit.

FIG. 7 illustrates a modification example of the planar configuration of the pixel array section in FIG. 3 on the side of the light-receiving surface.

FIG. 8 illustrates a modification example of the planar configuration of the pixel array section in FIG. 3 on the side of the logic circuit.

FIG. 9 illustrates a modification example of the planar configuration of the pixel array section in FIG. 3 on the side of the light-receiving surface.

FIG. 10 illustrates a modification example of the circuit configuration of the pixel array section in FIG. 1.

FIG. 11 illustrates an example of a planar configuration of the pixel array section having the circuit configuration in FIG. 10 on the side of the logic circuit.

FIG. 12 illustrates a modification example of a planar configuration of the pixel array section having the circuit configuration in FIG. 10 on the side of the light-receiving surface.

FIG. 13 illustrates a modification example of the planar configuration of the pixel array section on the side of the logic circuit.

FIG. 14 illustrates a modification example of the planar configuration of the pixel array section on the side of the light-receiving surface.

FIG. 15 illustrates a modification example of the circuit configuration of the pixel array section in FIG. 1.

FIG. 16 illustrates a modification example of the cross-sectional configuration of the pixel array section in FIG. 1.

FIG. 17 illustrates an example of a planar configuration of the pixel array section in FIG. 16 on the side of the logic circuit.

FIG. 18 illustrates an example of a planar configuration of the pixel array section in FIG. 16 on the side of the light-receiving surface.

FIG. 19 illustrates a modification example of the planar configuration of the pixel array section in FIG. 16 on the side of the logic circuit.

FIG. 20 illustrates a modification example of the planar configuration of the pixel array section in FIG. 16 on the side of the light-receiving surface.

FIG. 21 illustrates a modification example of the planar configuration of the pixel array section in FIG. 16 on the side of the logic circuit.

FIG. 22 illustrates a modification example of the planar configuration of the pixel array section in FIG. 16 on the side of the light-receiving surface.

FIG. 23 illustrates a modification example of the cross-sectional configuration of the pixel array section in FIG. 3.

FIG. 24 illustrates a modification example of the cross-sectional configuration of the pixel array section in FIG. 16.

FIG. 25 illustrates a modification example of the cross-sectional configuration of the pixel array section in FIG. 3.

FIG. 26 illustrates a modification example of the cross-sectional configuration of the pixel array section in FIG. 16.

FIG. 27 illustrates a modification example of the cross-sectional configuration of the pixel array section in FIG. 3.

FIG. 28 illustrates a modification example of the cross-sectional configuration of the pixel array section in FIG. 16.

FIG. 29 illustrates a modification example of a cross-sectional configuration of a portion of the pixel array section in any of FIGS. 3, 16, and 23 to 28.

FIG. 30 is an explanatory schematic view of a backbond in a crystal plane of an Si substrate of the present disclosure.

FIG. 31 is an explanatory schematic view of an off-angle at a front surface of the Si substrate of the present disclosure.

FIG. 32 illustrates an example of an outline configuration of an imaging system including the solid-state imaging device according to the foregoing embodiment.

FIG. 33 is a block diagram depicting an example of schematic configuration of a vehicle control system.

FIG. 34 is a diagram of assistance in explaining an example of installation positions of an outside-vehicle information detecting section and an imaging section.

MODES FOR CARRYING OUT THE INVENTION

Hereinafter, description is given in detail of embodiments of the present disclosure with reference to the drawings. It is to be noted that description is given in the following order.
1. Embodiment (Solid-State Imaging Device) . . . FIGS. 1 to 4
2. Modification Examples (Solid-State Imaging Device) . . . 5 to FIG. 31
3. Application Example (Imaging System) . . . 32
4. Example of Practical Application to Mobile Body . . . 33, FIG. 34

1. Embodiment

[Configuration]

Description is given of a solid-state imaging device 1 according to an embodiment of the present disclosure. The solid-state imaging device 1 is, for example, a back-illuminated image sensor of a global shutter method including a CMOS (Complementary Metal Oxide Semiconductor) image sensor, or the like. The solid-state imaging device 1 receives light from a subject and performs photoelectric conversion to generate an image signal, thereby capturing an image. The solid-state imaging device 1 outputs a pixel signal corresponding to incident light.

The global shutter method is a method in which global exposure is performed, which basically starts exposure simultaneously for all pixels and finishes the exposure simultaneously for all the pixels. Here, the term "all the pixels" refers to all of pixels of a portion appearing in an image, and excludes a dummy pixel, or the like. In addition, the global shutter method also includes a method in which a region where global exposure is performed is moved while performing global exposure in a unit of a plurality of rows (e.g., several tens of rows) instead of all pixels simultaneously when a time difference or an image distortion is small enough to be unproblematic. In addition, the global shutter method also includes a method in which global exposure is performed on pixels of a predetermined region, instead of all of the pixels of the portion appearing in the image.

The back-illuminated image sensor is an image sensor having a configuration in which a photoelectric conversion section such as a photodiode that receives light from a subject and converts the light into an electric signal is provided between a light-receiving surface on which light from the subject is incident and a wiring layer provided with a wiring line of a transistor, or the like that drives each pixel. It is to be noted that the present disclosure is not limited to the application to the CMOS image sensor.

FIG. 1 illustrates an example of an outline configuration of the solid-state imaging device 1 according to an embodiment of the present disclosure. The solid-state imaging device 1 includes a pixel array section 10 in which a plurality of sensor pixels 11 performing photoelectric conversion are arranged in matrix. The sensor pixel 11 corresponds to a specific example of a "pixel" of the present disclosure. FIG. 2 illustrates an example of a circuit configuration of the pixel array section 10. FIG. 3 illustrates an example of a cross-sectional configuration of the pixel array section 10. The solid-state imaging device 1 is configured, for example, by attaching two substrates (a first substrate 30 and a second substrate 40) together.

The first substrate 30 includes the plurality of sensor pixels 11 over a semiconductor substrate 31. The plurality of sensor pixels 11 are provided in matrix at positions opposed to a back surface (a light-receiving surface 31A) of the semiconductor substrate 31. The first substrate 30 further includes a plurality of readout circuits 12 over the semiconductor substrate 31. Each readout circuit 12 outputs a pixel signal based on charges outputted from the sensor pixel 11. The plurality of readout circuits 12 are provided one by one for the respective sensor pixels 11, for example. The readout circuit 12 includes, for example, a reset transistor RST, a selection transistor SEL, and an amplification transistor AMP.

The first substrate 30 includes a plurality of pixel drive lines extending in a row direction, and a plurality of data output lines VSL extending in a column direction. The pixel drive line is a wiring line to which a control signal controlling the output of charges accumulated in the sensor pixel 11 is applied, and extends in the row direction, for example. The data output line VSL is a wiring line through which the pixel signal outputted from each readout circuit 12 is outputted to a logic circuit 20, and extends in the column direction, for example.

The second substrate 40 includes, over a semiconductor substrate 41, the logic circuit 20 that processes the pixel signal. The logic circuit 20 includes, for example, a vertical drive circuit 21, a column signal processing circuit 22, a horizontal drive circuit 23, and a system control circuit 24. The logic circuit 20 (specifically, the horizontal drive circuit 23) outputs an output voltage for each sensor pixel 11 to the outside.

The vertical drive circuit 21 sequentially selects the plurality of sensor pixels 11 for respective predetermined unit pixel rows, for example. The term "predetermined unit pixel row" refers to a pixel row that is able to be pixel-selected with the same address.

The column signal processing circuit 22 conducts, for example, correlated double sampling (Correlated Double Sampling: CDS) processing on a pixel signal outputted from each sensor pixel 11 of a row selected by the vertical drive circuit 21. The column signal processing circuit 22 conducts, for example, the CDS processing to thereby extract a signal level of the pixel signal and to hold pixel data corresponding to an amount of light reception of each sensor pixel 11. The column signal processing circuit 22 includes, for example, a column signal processing section for each data output line VSL. The column signal processing section includes, for example, a single slope A/D converter. The single slope A/D converter includes, for example, a comparator and a counter circuit. The horizontal drive circuit 23 sequentially outputs, for example, the pixel data held in the column signal processing circuit 22 to the outside. The system control circuit 24 controls driving of each of the blocks (the vertical drive circuit 21, the column signal processing circuit 22, and the horizontal drive circuit 23) in the logic circuit 20, for example.

Each sensor pixel 11 includes mutually common components. Each sensor pixel 11 includes, for example, a photodiode PD, a transfer transistor TRG, and a floating diffusion FD. The transfer transistor TRG is, for example, an NMOS (Metal Oxide Semiconductor) transistor. The photodiode PD corresponds to a specific example of a "photoelectric conversion section" of the present disclosure. The transfer transistor TRG corresponds to a specific example of a "transfer transistor" of the present disclosure. The floating diffusion FD corresponds to a specific example of a "charge-holding section" of the present disclosure.

The photodiode PD photoelectrically converts light L incident through the light-receiving surface 31A. The photodiode PD performs photoelectric conversion to thereby generate charges corresponding to an amount of light reception. The photodiode PD is, for example, a PN junction photoelectric conversion element including an N-type semiconductor region 32A and a P-type semiconductor region 32B provided in the semiconductor substrate 31. A cathode of the photodiode PD is electrically coupled to a source of the transfer transistor TRG, and an anode of the photodiode PD is electrically coupled to a reference potential line (e.g., a ground GND). The transfer transistor TRG is formed in a layer different from the photodiode PD, and is formed at a position opposed to the photodiode PD in a normal direction of the semiconductor substrate 31.

The transfer transistor TRG is coupled between the photodiode PD and the floating diffusion FD, and transfers charges accumulated in the photodiode PD to the floating diffusion FD from the photodiode PD in response to a control signal applied to a gate electrode. The transfer transistor TRG transfers charges from the photodiode PD to the floating diffusion FD. A drain of the transfer transistor TRG is electrically coupled to the floating diffusion FD1, and the gate of the transfer transistor TRG is electrically coupled to the pixel drive line.

The transfer transistor TRG includes, as the gate electrode, two vertical gate electrodes VG and a coupling section CN. In the transfer transistor TRG, one vertical gate electrode VG is provided in one sensor pixel 11 of two sensor pixels 11 adjacent to each other, and another vertical gate electrode VG is provided in another sensor pixel 11 of the two sensor pixels 11 adjacent to each other. In the transfer transistor TRG, the coupling section CN is in contact with the two vertical gate electrodes VG. That is, in the two sensor pixels 11 adjacent to each other, the two vertical gate electrodes VG are electrically coupled together via the coupling section CN, and the two sensor pixels 11 adjacent to each other share the coupling section CN (a portion of the gate electrode). Here, the term "share" means that the outputs of the two sensor pixels 11 adjacent to each other are controlled by the common coupling section CN.

The floating diffusion FD is a floating diffusion region that temporarily holds charges outputted from the photodiode PD via the transfer transistor TRG. For example, the reset transistor RST is coupled to the floating diffusion FD, and, in addition, a vertical signal line VSL is coupled to the floating diffusion FD via the amplification transistor AMP and the selection transistor SEL.

In the reset transistor RST, a drain is coupled to a power source line VDD, and a source is coupled to the floating diffusion FD. The reset transistor RST initializes (resets) the floating diffusion FD in response to a control signal applied to the gate electrode. For example, when the reset transistor RST is turned ON, a potential of the floating diffusion FD is reset to a potential level of the power source line VDD. That is, the floating diffusion FD is initialized.

The amplification transistor AMP has a gate electrode coupled to the floating diffusion FD and a drain coupled to the power source line VDD, and serves as an input section of a source follower circuit that reads charges obtained by photoelectric conversion at the photodiode PD. That is, the amplification transistor AMP has a source that is coupled to the vertical signal line VSL via the selection transistor SEL to thereby configure the source follower circuit together with a constant current source coupled to one end of the vertical signal line VSL.

The selection transistor SEL is coupled between the source of the amplification transistor AMP and the vertical signal line VSL, and a control signal is supplied as a selection signal to a gate electrode of the selection transistor SEL. When the control signal is turned ON, the selection transistor SEL is brought into an electrically-conductive state, and the sensor pixel 11 linked to selection transistor SEL is brought into a selected state. When the sensor pixel 11 is in the selected state, a pixel signal outputted from the amplification transistor AMP is read by the column signal processing circuit 22 via the vertical signal line VSL.

Next, description is given in detail, with reference to FIGS. 3, 4, and 5, of a configuration of the sensor pixel 11. FIG. 4 illustrates an example of a planar configuration the pixel array section 10 on side of the logic circuit 20. FIG. 5 illustrates an example of a planar configuration of the pixel array section 10 on side of the light-receiving surface 31A. It is to be noted that, in FIG. 4, a layout of various transistors (the reset transistor RST, the amplification transistor AMP, and the selection transistor SEL) included in the readout circuit 12 is overlapped on a planar configuration of the semiconductor substrate 31 on the side of the logic circuit 20. In addition, in FIG. 5, a layout of the vertical gate electrodes VG is overlapped on a planar configuration of the semiconductor substrate 31 on the side of the light-receiving surface 31A.

The first substrate 30 is configured by stacking a semiconductor layer 33 and an insulating layer 32 in this order on the semiconductor substrate 31. That is, the insulating layer 32 is formed in contact with a top surface of the semiconductor layer 33. The transfer transistor TRG and the floating diffusion FD are formed on the top surface of the semiconductor layer 33. Therefore, the top surface of the semiconductor layer 33 is a forming surface 31B of the transfer transistor TRG, or the like. It is to be noted that a stack including the semiconductor substrate 31 and the semiconductor layer 33 may also be regarded as a semiconductor substrate. In this case, a top surface of the stack (semiconductor substrate) including the semiconductor substrate 31 and the semiconductor layer 33 is the forming surface 31B, and a back surface of the stack (semiconductor substrate) including the semiconductor substrate 31 and the semiconductor layer 33 is the light-receiving surface 31A. At this time, each sensor pixel 11 is formed in the stack (semiconductor substrate) including the semiconductor substrate 31 and the semiconductor layer 33.

The gate of the transfer transistor TRG and a wiring line coupled to the gate of the transfer transistor TRG are provided in the insulating layer 32. The gate of the transfer transistor TRG and the wiring line coupled to the gate of the transfer transistor TRG are formed by a metal material, for example. It is to be noted that the gate of the transfer transistor TRG may be formed by polysilicon. The readout circuit 12 is provided in the insulating layer 32. It is to be noted that the readout circuit 12 may be formed on the forming surface 31B of the semiconductor substrate 31.

The semiconductor substrates 31 and 41 are each configured by a silicon substrate, for example. The semiconductor layer 33 is configured by a silicon layer formed by epitaxial crystal growth, for example. The semiconductor substrate 31 includes, on a portion of the top surface and in the vicinity thereof, the P-type semiconductor region 32B, and the N-type semiconductor region 32A of an electrically-conductive type different from that of the P-type semiconductor region 32B at a region deeper than the P-type semiconductor region 32B. The P-type semiconductor region 32B is provided on side of a surface, of the semiconductor substrate 31, opposite to the light-receiving surface 31A. The electrically-conductive type of the P-type semiconductor region 32B is P-type. The electrically-conductive type of the N-type semiconductor region 32A is N-type which is an electrically-conductive type different from that of the P-type semiconductor region 32B. The semiconductor layer 33 has an electrically-conductive type of P-type which is the same as that of the P-type semiconductor region 32B. The semiconductor layer 33 includes the floating diffusion FD of an electrically-conductive type different from that of the semiconductor layer 33. A portion (two vertical gate electrodes VG) of the gate of the transfer transistor TRG is formed to extend in a thickness direction (normal direction) of the semiconductor substrate 31 from the top surface (forming surface 31B) of the semiconductor layer 33. The portion (two vertical gate electrodes VG) of the gate of the transfer transistor TRG extends to such a depth as to reach the N-type semiconductor region 32A from the forming surface 31B. The portion (two vertical gate electrodes VG) of the gate of the transfer transistor TRG has, for example, a rod shape extending in the thickness direction (normal direction) of the semiconductor substrate 31.

The first substrate 30 further includes, for example, a fixed-charge film 36 in contact with the back surface (light-receiving surface 31A) of the semiconductor substrate 31. The fixed-charge film 36 has negative fixed charges in order to suppress generation of a dark current due to an interface state of the semiconductor substrate 31 on the side of the light-receiving surface 31A. The fixed-charge film 36 is formed by, for example, an insulating film having negative fixed charges. Examples of a material of such an insulating film include hafnium oxide, zircon oxide, aluminum oxide, titanium oxide, and tantalum oxide. An electric field induced by the fixed-charge film 36 forms a hole accumulation layer at an interface of the semiconductor substrate 31 on the side of the light-receiving surface 31A. This hole accumulation layer suppresses generation of electrons from the interface. The first substrate 30 further includes, for example, a color filter 37. The color filter 37 is provided over the semiconductor substrate 31 on the side of the light-receiving surface 31A. The color filter 37 is provided in contact with the fixed-charge film 36, for example, and is provided at a position opposed to the sensor pixel 11 with the fixed-charge film 36 interposed therebetween.

Each sensor pixel 11 includes a light-receiving lens 50 on side of the back surface (light-receiving surface 31A) of the semiconductor substrate 31. That is, the solid-state imaging device 1 incudes a plurality of light-receiving lenses 50 provided one by one for the respective sensor pixels 11. The plurality of light-receiving lenses 50 are provided one by one for respective photodiodes PD, and are arranged at positions opposed to the photodiodes PD. That is, the solid-state imaging device 1 is a back-illuminated imaging device. The light-receiving lens 50 is provided in contact with the color filter 37, for example, and is provided at a position opposed to the sensor pixel 11 with the color filter 37 and the fixed-charge film 36 interposed therebetween.

The first substrate 30 includes separation sections 51, 52, and 54 that electrically and optically separate the two adjacent sensor pixels 11 from each other. The separation sections 51,52, and 54 corresponds to a specific example of a "separation section" of the present disclosure. The separation sections 51, 52, and 54 are formed to extend in the normal direction (thickness direction) of the semiconductor substrate 31. The separation sections 51 and 52 are stacked in the normal direction (thickness direction) of the semiconductor substrate 31, within the semiconductor substrate 31 and the semiconductor layer 33. In other words, the separation sections 51 and 52 are linked to each other. A structure including the separation sections 51 and 52 is formed to extend from the light-receiving surface 31A to the forming surface 31B. That is, the structure including the separation sections 51 and 52 penetrates the semiconductor substrate 31 and the semiconductor layer 33. Likewise, the separation section 54 is formed to extend in the normal direction (thickness direction) of the semiconductor substrate 31, within the semiconductor substrate 31 and the semiconductor layer 33. The separation section 54 is formed to extend from the light-receiving surface 31A to the forming surface 31B. That is, the separation section 54 penetrates the semiconductor substrate 31 and the semiconductor layer 33.

The separation sections 51 and 54 are integrally formed, and is formed, for example, to surround the sensor pixel 11 (in particular, photodiode PD) in a horizontal in-plane direction, and are further formed to extend in the normal direction (thickness direction) of the semiconductor substrate 31. The separation sections 52 and 54 are formed, for example, to surround the sensor pixel 11 (in particular, the transfer transistor TRG and the floating diffusion FD) in a horizontal in-plane direction, and are further formed to extend in the normal direction (thickness direction) of the semiconductor substrate 31.

The separation sections 51 and 54 are each, for example, a high-resistance region formed by implanting impurities into the semiconductor substrate 31. The separation section 52 includes, for example, a DTI (Deep Trench Isolation) structure. In the separation section 52, the DTI includes an insulating film 52B in contact with an inner wall of a trench provided in the semiconductor substrate 31 and a metal-embedded section 52A provided inside the insulating film 52B. The metal-embedded section 52A is formed to extend from the forming surface 31B to a predetermined depth. The insulating film 52B is, for example, an oxide film formed by thermally oxidizing the semiconductor substrate 31, and is formed by silicon oxide, for example. The metal-embedded section 52A is a ring-shaped metal layer that surrounds the sensor pixel 11 (in particular, the transfer transistor TRG and the floating diffusion FD) in a horizontal in-plane direction. The metal-embedded section 52A is formed using CVD (Chemical Vapor Deposition), for example, and is formed by aluminum or an aluminum alloy, for example.

The first substrate 30 further includes, for each sensor pixel 11, a light-blocking section 53 disposed in the layer between the photodiode PD and the floating diffusion FD. The light-blocking section 53 has an opening 53H through which the vertical gate electrode VG penetrates. In the two sensor pixels 11 adjacent to each other, the two vertical gate electrodes VG are arranged to be opposed to each other with the separation section 54 interposed therebetween, and are in contact with the separation section 54. The coupling section CN is in contact with the top of the separation section 54 and the top of each of the two vertical gate electrodes VG arranged to be opposed to each other. The light-blocking section 53 has the opening 53H at a location which is in contact with the separation section 54 and through which the vertical gate electrode VG penetrates. That is, the light-blocking section 53 has the opening 53H at a location opposed to the gate of the transfer transistor TRG. The light-blocking section 53 blocks incidence of light L, having been incident through the light-receiving surface 31A, on the floating diffusion FD at a location other than the opening 53H.

The light-blocking section 53 includes, for example, an insulating film 53B in contact with an inner wall of a hollow section 58 provided in the first substrate 30, and a metal-embedded section 53A provided inside the insulating film 53B. The metal-embedded section 53A corresponds to a specific example of a "light-blocking section" of the present disclosure.

The hollow section 58 extends in a stacked in-plane direction in the semiconductor layer 33. The hollow section 58 is formed at a predetermined location in the semiconductor layer 33 by means of wet etching using a predetermined chemical solution, for example. An etching stop layer may be provided, for example, at a location, of the hollow section 58, opposed to the vertical gate electrode VG. The etching stop layer is configured by a material having an etching rate with respect to the above-mentioned chemical solution relatively lower than that of the semiconductor layer 33.

The insulating film 53B is formed using CVD, for example. The insulating film 53B is formed by, for example, a dielectric material such as $SiO_2$. The insulating film 53B has, for example, a stacked structure including an $SiO_2$ film (silicon oxide film), an SCF film, and an $SiO_2$ film (silicon oxide film). It is to be noted that the insulating film 53B may be a single layer film including $SiO_2$ (silicon oxide). The metal-embedded section 53A is formed using the CVD, for example. The metal-embedded section 53A may be collectively formed using the CVD, for example. The metal-embedded section 53A is formed by aluminum or an aluminum alloy, for example.

The metal-embedded section 53A is formed in contact with a lower part of the metal-embedded section 52A of the separation section 52. The metal-embedded section 53A blocks incidence of light, having been incident through the back surface (light-receiving surface 31A) of the semiconductor substrate 31, on the floating diffusion FD. The metal-embedded section 53A is disposed in the layer between the photodiode PD and the floating diffusion FD. The metal-embedded section 53A is a sheet-like metal layer extending in a direction orthogonal to the normal direction (thickness direction) of the semiconductor substrate 31. The metal-embedded section 53A has an opening through which the vertical gate electrode VG penetrates. The insulating film 53B covers the metal-embedded section 53A, and insulates and separates the metal-embedded section 53A and the vertical gate electrode VG from each other. The metal-embedded section 53A and the vertical gate electrode VG are arranged, for example, with the insulating film 53B and a portion of the semiconductor layer 33 (hereinafter, referred to as a "semiconductor part 33A") interposed therebetween.

Effects

Next, description is given of effects of the solid-state imaging device 1 according to the present embodiment.

A global shutter method using a CMOS image sensor has been known (e.g., see PTL 1) in the solid-state imaging device. In the invention described in PTL 1 above, by providing the charge-holding section to which charges accumulated in a photoelectric conversion section is transferred at a depth different from the photoelectric conversion section, it is possible to secure the number of saturated electrons while securing an area of the photoelectric conversion section.

However, in the invention described above in PTL 1, there is a possibility that noise may be generated due to incidence of light on the charge-holding section. In order to reduce the noise, it is conceivable to provide the light-blocking layer. In a case where the light-blocking layer is provided, charge transfer from the photoelectric conversion section to the charge-holding section becomes difficult. In order to facilitate the charge transfer, it is conceivable to provide the vertical gate electrode reaching the photoelectric conversion section from an opening provided in the light-blocking layer. In a case where the vertical gate electrode is provided, pixel size is increased, and, moreover, noise is increased, which is caused by the light incidence on the charge-holding section from the opening provided in the light-blocking layer.

Meanwhile, in the present embodiment, the vertical gate electrode VG reaching the photodiode PD is provided. This makes it possible to avoid deterioration of the charge transfer from the photodiode PD to the floating diffusion FD, caused by provision of the light-blocking section 53. Further, in the present embodiment, the two vertical gate electrodes VG are electrically coupled together in the two sensor pixels 11 adjacent to each other. This makes it possible to reduce the size of the transfer transistor TRG, as compared with a case where the transfer transistors TRG are provided separately for the respective sensor pixels 11; accordingly, it is possible to reduce the size of the opening 53H, of the light-blocking section 53, through which the vertical gate electrode VG penetrates. As a result, it is possible to suppress an increase in noise and pixel size. Therefore, it is possible to avoid deterioration of the charge transfer while suppressing the increase in the noise and the pixel size.

In the present embodiment, the coupling section CN in contact with the two vertical gate electrodes VG and electrically coupling the two vertical gate electrodes VG together is provided in the two sensor pixels 11 adjacent to each other. This makes it possible to reduce the size of the transfer transistor TRG, as compared with the case where the transfer transistors TRG are provided separately for the respective sensor pixels 11; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

In the present embodiment, in the two sensor pixels 11 adjacent to each other, the two vertical gate electrodes VG are arranged to be opposed to each other with the separation section 54 interposed therebetween, and are in contact with the separation section 54. Further, the coupling section CN is in contact with the top of the separation section 54 and the top of each of the two vertical gate electrodes VG arranged to be opposed to each other. This makes it possible to reduce the size of the transfer transistor TRG, as compared with the case where the transfer transistors TRG are provided separately for the respective sensor pixels 11; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

In the present embodiment, the opening 53H is provided at a location which is in contact with the separation section 54 and through which the vertical gate electrode VG penetrates. This makes it possible to reduce the size of the transfer transistor TRG, as compared with the case where the transfer transistors TRG are provided separately for the respective sensor pixels 11; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

2. Modification Examples

Hereinafter, description is given of modification examples of the solid-state imaging device 1 according to the foregoing embodiment.

Modification Example A

In the above embodiment, each sensor pixel 11 may have a plurality of transfer transistors TRG. For example, as illustrated in FIGS. 6 and 7, each sensor pixel 11 may have two transfer transistors TRG. FIG. 6 illustrates a modification example of a planar configuration of the pixel array section 10 on the side of the logic circuit 20. FIG. 7 illustrates a modification example of a planar configuration of the pixel array section 10 on the side of the light-receiving surface 31A. It is to be noted that, in FIG. 6, a layout of various transistors (the reset transistor RST, the amplification transistor AMP, and the selection transistor SEL) included in the readout circuit 12 is overlapped on the planar configuration of the semiconductor substrate 31 on the side of the logic circuit 20. In addition, in FIG. 7, a layout of the vertical gate electrodes VG is overlapped on the planar configuration of the semiconductor substrate 31 on the side of the light-receiving surface 31A.

A discharge transistor OFG is, for example, an NMOS transistor. The discharge transistor OFG discharges charges from the photoelectric conversion section in response to a control signal applied to a gate electrode. The discharge transistor OFG has a configuration common to the transfer transistor TRG, and includes, as the gate electrode, two vertical gate electrodes VG and the coupling section CN. In each transfer transistor TRG, one vertical gate electrode VG is provided in one sensor pixel 11 of two sensor pixels 11 adjacent to each other, and another vertical gate electrode VG is provided in another sensor pixel 11 of the two sensor pixels 11 adjacent to each other. In each transfer transistor TRG, the coupling section CN is in contact with the two vertical gate electrodes VG. That is, in the two sensor pixels 11 adjacent to each other, the two vertical gate electrodes VG are electrically coupled together via the coupling section CN, and the two sensor pixels 11 adjacent to each other share the coupling section CN (a portion of the gate electrode). Here, the term "share" means that the discharges of the charges in the two sensor pixels 11 adjacent to each other are controlled by the common coupling section CN.

In the present modification example, the transfer transistor TRG corresponds to a specific example of the "transfer transistor" of the present disclosure. In addition, in the present modification example, the vertical gate electrode VG of the one transfer transistor TRG corresponds to a specific example of a "first vertical gate electrode" of the present disclosure, and the vertical gate electrode VG of the other transfer transistor TRG corresponds to a specific example of a "second vertical gate electrode" of the present disclosure.

In the present modification example, the coupling section CN is in contact with the two vertical gate electrodes VG in the transfer transistor TRG. That is, in the two sensor pixels 11 adjacent to each other, the two vertical gate electrodes VG included in the transfer transistor TRG are electrically coupled together via the coupling section CN, and the two sensor pixels 11 adjacent to each other share the coupling section CN (a portion of the gate electrode) described above. In the two sensor pixels 11 adjacent to each other, the two vertical gate electrodes VG included in the transfer transistor TRG are arranged to be opposed to each other with the separation section 54 interposed therebetween, and are in contact with the separation section 54. In the transfer transistor TRG, the coupling section CN described above is in contact with the top of the separation section 54 and the top of each of the two vertical gate electrodes VG arranged to be opposed to each other.

In the present modification example, the light-blocking section 53 has the opening 53H at a location which is in contact with the separation section 54 and through which the vertical gate electrode VG included in the transfer transistor TRG penetrates. The two transfer transistors TRG provided in each sensor pixel 11 are arranged to be adjacent to each other, and the floating diffusion FD is disposed to be adjacent to a gap between the two vertical gate electrodes VG.

In the present modification example, the two transfer transistors TRG are provided in each sensor pixel 11. This improves the charge transfer from the photodiode PD to the floating diffusion FD, as compared with a case where one transfer transistor TRG is provided in each sensor pixel 11.

In the present modification example, the two transfer transistors TRG provided in each sensor pixel 11 are arranged to be adjacent to each other. Further, in each sensor pixel 11, the floating diffusion FD is disposed to be adjacent to the gap between the two vertical gate electrodes VG. This improves the charge transfer from the photodiode PD to the floating diffusion FD, as compared with a case where the floating diffusion FD is disposed away from the gap between the two vertical gate electrodes VG.

In the present modification example, there is provided, in the transfer transistor TRG, the coupling section CN in contact with the two vertical gate electrodes VG and electrically coupling the two vertical gate electrodes VG together. This makes it possible to reduce the size of the transfer transistor TRG, as compared with the case where the transfer transistors TRG are provided separately for the respective sensor pixels 11; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

In the present modification example, in the transfer transistor TRG, the two vertical gate electrodes VG are arranged to be opposed to each other with the separation section 54 interposed therebetween, and are in contact with the separation section 54. Further, the coupling section CN is in contact with the top of the separation section 54 and the top of each of the two vertical gate electrodes VG that are arranged to be opposed to each other. This makes it possible to reduce the size of the transfer transistor TRG, as compared with the case where the transfer transistors TRG are provided separately for the respective sensor pixels 11; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

In the present modification example, the opening 53H is provided at a location which is in contact with the separation section 54 and through which the two vertical gate electrodes VG penetrate. This makes it possible to reduce the size of the transfer transistor TRG, as compared with the case where the transfer transistors TRG are provided separately for the respective sensor pixels 11; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

Modification Example B

In the foregoing embodiment, the transfer transistor TRG may further include, for each sensor pixel 11, one vertical gate electrode VG not coupled to the coupling section CN, for example, as illustrated in FIGS. 8 and 9. FIG. 8 illustrates a modification example of the planar configuration of the pixel array section 10 on the side of the logic circuit 20. FIG. 9 illustrates a modification example of the planar configuration of the pixel array section 10 on the side of the light-receiving surface 31A. It is to be noted that, in FIG. 8, a layout of various transistors (the reset transistor RST, the amplification transistor AMP, and the selection transistor SEL) included in the readout circuit 12 is overlapped on the planar configuration of the semiconductor substrate 31 on the side of the logic circuit 20. In addition, in FIG. 9, a layout of the vertical gate electrodes VG is overlapped on the planar configuration of the semiconductor substrate 31 on the side of the light-receiving surface 31A.

In the present modification example, each sensor pixel 11 includes the floating diffusion FD at a position adjacent to a gap between the vertical gate electrode VG coupled to the coupling section CN and the vertical gate electrode VG not coupled to the coupling section CN. This improves the charge transfer from the photodiode PD to the floating diffusion FD, as compared with the case where the floating diffusion FD is disposed away from the gap between the two vertical gate electrodes VG.

Modification Example C

In the foregoing embodiment and modification examples thereof, the transfer transistor TRG may include, as the gate electrode, four vertical gate electrodes VG and the coupling section CN. In this case, in the transfer transistor TRG, the four vertical gate electrodes VG are provided one by one for respective four sensor pixels 11 adjacent to one another, as illustrated in FIGS. 10, 11, and 12.

FIG. 10 illustrates an example of a circuit configuration of the pixel array section 10 according to the present modification example. FIG. 11 illustrates an example of a planar configuration the pixel array section 10 according to the present modification example on the side of the logic circuit 20. FIG. 12 illustrates an example of a planar configuration of the pixel array section 10 according to the present modification example on the side of the light-receiving surface 31A. It is to be noted that, in FIG. 11, a layout of various transistors (the reset transistor RST, the amplification transistor AMP, and the selection transistor SEL) included in the readout circuit 12 is overlapped on the planar configuration of the semiconductor substrate 31 on the side of the logic circuit 20. In addition, in FIG. 12, a layout of the vertical gate electrodes VG is overlapped on the planar configuration of the semiconductor substrate 31 on the side of the light-receiving surface 31A.

In the present modification example, the coupling section CN is in contact with the four vertical gate electrodes VG in the transfer transistor TRG. That is, in the four sensor pixels 11 adjacent to one another, the four vertical gate electrodes VG are electrically coupled to one another via the coupling section CN, and the four sensor pixels 11 adjacent to one another share the coupling section CN (a portion of the gate electrode).

In the present modification example, in the four sensor pixels 11 adjacent to one another, the four vertical gate electrodes VG are arranged to be opposed to one another with the separation section 54 interposed thereamong, and are in contact with the separation section 54. The coupling section CN is in contact with the top of the separation section 54 and the top of each of the four vertical gate electrodes VG arranged to be opposed to one another. The light-blocking section 53 includes the opening 53H at a location which is in contact with the separation section 54 and through which the vertical gate electrode VG penetrates.

In this manner, in the present modification example, the four vertical gate electrodes VG and the coupling section CN are provided, as the gate electrode, in the transfer transistor TRG. This makes it possible to reduce the size of the transfer transistor TRG, as compared with the case where the transfer transistors TRG are provided separately for the respective sensor pixels 11; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

Modification Example D

In the foregoing embodiment and modification examples thereof, each sensor pixel 11 may include the transfer transistor TRG and the discharge transistor OFG, for example, as illustrated in FIGS. 13 and 14. FIG. 13 illustrates a modification example of the planar configuration of the pixel array section 10 on the side of the logic circuit 20. FIG. 14 illustrates a modification example of the planar configuration of the pixel array section 10 on the side of the light-receiving surface 31A. It is to be noted that, in FIG. 13, a layout of various transistors (the reset transistor RST, the amplification transistor AMP, and the selection transistor SEL) included in the readout circuit 12 is overlapped on the planar configuration of the semiconductor substrate 31 on the side of the logic circuit 20. In addition, in FIG. 14, a layout of the vertical gate electrodes VG is overlapped on the planar configuration of the semiconductor substrate 31 on the side of the light-receiving surface 31A.

The discharge transistor OFG is, for example, an NMOS transistor. The discharge transistor OFG discharges charges from the photoelectric conversion section in response to a control signal applied to the gate electrode. The discharge transistor OFG has a configuration common to the transfer transistor TRG, and includes, as the gate electrode, two vertical gate electrodes VG and the coupling section CN. In the discharge transistor OFG, one vertical gate electrode VG is provided in one sensor pixel 11 of two sensor pixels 11 adjacent to each other, and another vertical gate electrode VG is provided in another sensor pixel 11 of the two sensor pixels 11 adjacent to each other. In the discharge transistor OFG, the coupling section CN is in contact with the two vertical gate electrodes VG. That is, in the two sensor pixels 11 adjacent to each other, the two vertical gate electrodes VG are electrically coupled together via the coupling section CN, and the two sensor pixels 11 adjacent to each other share the coupling section CN (a portion of the gate electrode). Here, the term "share" means that the discharges of the charges in the two sensor pixels 11 adjacent to each other are controlled by the common coupling section CN.

In the present modification example, the transfer transistor TRG corresponds to a specific example of the "transfer transistor" of the present disclosure, and the discharge transistor OFG corresponds to a specific example of a "discharge transistor" of the present disclosure. In addition, in the present modification example, the vertical gate electrode VG of the transfer transistor TRG corresponds to a specific example of the "first vertical gate electrode" of the present disclosure, and the vertical gate electrode VG of the discharge transistor OFG corresponds to a specific example of the "second vertical gate electrode" of the present disclosure.

In the present modification example, the coupling section CN is in contact with the two vertical gate electrodes VG in the transfer transistor TRG. That is, in the two sensor pixels 11 adjacent to each other, the two vertical gate electrodes VG included in the transfer transistor TRG are electrically coupled together via the coupling section CN, and the two sensor pixels 11 adjacent to each other share the coupling section CN (a portion of the gate electrode) described above. In the two sensor pixels 11 adjacent to each other, the two vertical gate electrodes VG included in the transfer transistor TRG are arranged to be opposed to each other with the separation section 54 interposed therebetween, and are in contact with the separation section 54. In the transfer transistor TRG, the coupling section CN described above is in contact with the top of the separation section 54 and the top of each of the two vertical gate electrodes VG arranged to be opposed to each other.

In the present modification example, further, the coupling section CN is in contact with the two vertical gate electrodes VG in the discharge transistor OFG. That is, in the two sensor pixels 11 adjacent to each other, the two vertical gate electrodes VG included in the discharge transistor OFG are electrically coupled together via the coupling section CN, and the two sensor pixels 11 adjacent to each other share the coupling section CN (a portion of the gate electrode) described above. In the two sensor pixels 11 adjacent to each other, the two vertical gate electrodes VG included in the discharge transistor OFG are arranged to be opposed to each other with the separation section 54 interposed therebetween, and are in contact with the separation section 54. In the discharge transistor OFG, the coupling section CN described above is in contact with the top of the separation section 54 and the top of each of the two vertical gate electrodes VG arranged to be opposed to each other.

In the present modification example, the light-blocking section 53 has the opening 53H at a location which is in contact with the separation section 54 and through which the vertical gate electrode VG included in the transfer transistor TRG and the vertical gate electrode VG included in the discharge transistor OFG penetrate. The transfer transistor TRG and the discharge transistor OFG provided in each sensor pixel 11 are arranged to be adjacent to each other, and the floating diffusion FD is disposed to be adjacent to a gap between the two vertical gate electrodes VG.

In the present modification example, the transfer transistor TRG and the discharge transistor OFG are provided in each sensor pixel 11. This improves the charge transfer from the photodiode PD to the floating diffusion FD, as compared with the case where one transfer transistor TRG is provided in each sensor pixel 11.

In the present modification example, the transfer transistor TRG and the discharge transistor OFG provided in each sensor pixel 11 are arranged to be adjacent to each other. Further, in each sensor pixel 11, the floating diffusion FD is disposed to be adjacent to the gap between the two vertical gate electrodes VG. This improves the charge transfer from the photodiode PD to the floating diffusion FD, as compared with the case where the floating diffusion FD is disposed away from the gap between the two vertical gate electrodes VG.

In the present modification example, there is provided, in the transfer transistor TRG, the coupling section CN in contact with the two vertical gate electrodes VG and electrically coupling the two vertical gate electrodes VG together. Further, in the present modification example, there is provided, in the discharge transistor OFG, the coupling section CN in contact with the two vertical gate electrodes VG and electrically coupling the two vertical gate electrodes VG together. This makes it possible to reduce the sizes of the transfer transistor TRG and the discharge transistor OFG, as compared with a case where the transfer transistor TRG and the discharge transistor OFG are provided for each sensor pixel 11 separately; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

In the present modification example, in the transfer transistor TRG, the two vertical gate electrodes VG are arranged to be opposed to each other with the separation section 54 interposed therebetween, and are in contact with the separation section 54. Further, the coupling section CN is in contact with the top of the separation section 54 and the top of each of the two vertical gate electrodes VG that are arranged to be opposed to each other. Further, in the present modification example, in the discharge transistor OFG, the two vertical gate electrodes VG are arranged to be opposed to each other with the separation section 54 interposed therebetween, and are in contact with the separation section 54. Further, the coupling section CN is in contact with the top of the separation section 54 and the top of each of the two vertical gate electrodes VG that are arranged to be opposed to each other. This makes it possible to reduce the sizes of the transfer transistor TRG and the discharge transistor OFG, as compared with the case where the transfer transistor TRG and the discharge transistor OFG are provided for each sensor pixel 11 separately; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

In the present modification example, the opening 53H is provided at a location which is in contact with the separation section 54 and through which the two vertical gate electrodes VG penetrate. This makes it possible to reduce the size of the transfer transistor TRG, as compared with the case where the transfer transistors TRG are provided separately for the respective sensor pixels 11; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

Modification Example E

In the foregoing embodiment and modification examples thereof, each sensor pixel 11 may include, for example, the photodiode PD, the transfer transistor TRG, a transfer transistor TRM, a charge-holding section MEM, a transfer transistor TRX, the floating diffusion FD, the discharge transistor OFG, and a discharge floating diffusion OFD, as illustrated in FIGS. 15, 16, 17, and 18.

FIG. 15 illustrates an example of a circuit configuration of the pixel array section 10 according to the present modification example. FIG. 16 illustrates an example of a cross-sectional configuration of the pixel array section 10 according to the present modification example. FIG. 17 illustrates an example of a planar configuration of the pixel array section 10 according to the present modification example on the side of the logic circuit 20. FIG. 18 illustrates an example of a planar configuration of the pixel array section 10 according to the present modification example on the side of the light-receiving surface 31A. It is to be noted that, in FIG.

17, a layout of various transistors (the reset transistor RST, the amplification transistor AMP, and the selection transistor SEL) included in the readout circuit 12 is overlapped on the planar configuration of the semiconductor substrate 31 on the side of the logic circuit 20. In addition, in FIG. 18, a layout of the vertical gate electrodes VG is overlapped on the planar configuration of the semiconductor substrate 31 on the side of the light-receiving surface 31A.

The transfer transistors TRG, TRM, TRX, and OFG are each an NMOS transistor, for example. FIG. 15 illustrates a case where a portion of the gate of the transfer transistor TRG is shared by two sensor pixels 11 adjacent to each other. It is to be noted that, in the present modification example, the portion of the gate of the transfer transistor TRG may be shared by four sensor pixels 11 adjacent to one another.

In the present modification example, the transfer transistor TRG is coupled between the photodiode PD and the transfer transistor TRM, and transfers charges accumulated in the photodiode PD to the transfer transistor TRM in response to a control signal applied to the gate. The transfer transistor TRG transfers charges from the photodiode PD to the charge-holding section MEM. For example, when the discharge transistor OFG is turned OFF and the transfer transistor TRG is turned ON, the charges held in the photodiode PD are transferred to the floating diffusion FD via the transfer transistor TRG. The drain of the transfer transistor TRG is electrically coupled to a source of the transfer transistor TRM, and the gate of the transfer transistor TRG is coupled to the pixel drive line.

The transfer transistor TRM is coupled between the transfer transistor TRG and the transfer transistor TRX, and controls a potential of the charge-holding section MEM in response to a control signal applied to a gate. For example, when the transfer transistor TRM is turned ON, the potential of the charge-holding section MEM becomes deeper, and when the transfer transistor TRM is turned OFF, the potential of the charge-holding section MEM becomes shallower. Then, for example, when the transfer transistor TRG and the transfer transistor TRM are turned ON, the charges accumulated in the photodiode PD are transferred to the charge-holding section MEM via the transfer transistor TRG and the transfer transistor TRM. A drain of the transfer transistor TRM is electrically coupled to a source of the transfer transistor TRX, and the gate of the transfer transistor TRM is coupled to the pixel drive line.

The charge-holding section MEM is a region that temporarily holds the charges accumulated in the photodiode PD in order to implement a global shutter function. The charge-holding section MEM holds charges transferred from the photodiode PD.

The transfer transistor TRX is coupled between the transfer transistor TRM and the floating diffusion FD, and transfers charges held by the charge-holding section MEM to the floating diffusion FD in response to a control signal applied to a gate. For example, when the transfer transistor TRM is turned OFF and the transfer transistor TRX is turned ON, the charges held by the charge-holding section MEM are transferred to the floating diffusion FD via the transfer transistor TRM and the transfer transistor TRX. A drain of the transfer transistor TRX is electrically coupled to the floating diffusion FD, and the gate of the transfer transistor TRX is coupled to the pixel drive line.

The floating diffusion FD is a floating diffusion region that temporarily holds charges outputted from the photodiode PD via the transfer transistor TRX. For example, the reset transistor RST is coupled to the floating diffusion FD, and, in addition, the vertical signal line VSL is coupled to the floating diffusion FD via the amplification transistor AMP and the selection transistor SEL.

In the discharge transistor OFG, a drain is coupled to the power source line VDD, and a source is coupled between the transfer transistor TRG and the transfer transistor TRM. The discharge transistor OFG initializes (resets) the photodiode PD in response to a control signal applied to a gate. For example, when the transfer transistor TRG and the discharge transistor OFG are turned ON, a potential of the photodiode PD is reset to a potential level of the power source line VDD. That is, the photodiode PD is initialized. In addition, the discharge transistor OFG forms an overflow path between the transfer transistor TRG and the power source line VDD, for example, and discharges charges overflowing from the photodiode PD to the power source line VDD.

The transfer transistors TRG, TRM and TRX, the charge-holding section MEM, the floating diffusion FD, and the discharge transistor OFG are formed on the top surface (forming surface 31B) of the semiconductor layer 33. The gate electrodes of the transfer transistors TRG, TRM and TRX and the discharge transistor OFG as well as wiring lines coupled to these gate electrodes are provided in the insulating layer 32.

In the present modification example, similarly to the foregoing embodiment and modification examples thereof, the vertical gate electrode VG reaching the photodiode PD is provided. This makes it possible to avoid deterioration of the charge transfer from the photodiode PD to the floating diffusion FD, caused by the provision of the light-blocking section 53. Further, in the present modification example, a plurality of (e.g., two or four) vertical gate electrodes VG are electrically coupled together in a plurality of (e.g., two or four) sensor pixels 11 adjacent to each other. This makes it possible to reduce the size of the transfer transistor TRG, as compared with the case where the transfer transistors TRG are provided separately for the respective sensor pixels 11; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

In the present modification example, each sensor pixel 11 may include a buffer region between the vertical gate electrode VG and the charge-holding section MEM. The buffer region is, for example, an N-type semiconductor region of the same electrically-conductive type as that of the charge-holding section MEM. In a case where accumulated charges overflow, for example, due to irradiation of the photodiode PD with a large amount of light, providing the buffer region in this manner makes it possible to prevent the overflowing charges from directly entering the charge-holding section MEM.

In the present modification example, the readout circuit 12 may be provided in the insulating layer 32 instead of being provided on the forming surface 31B of the semiconductor substrate 31. That is, the readout circuit 12 may be provided in a layer different from that of each transistor (e.g., the transfer transistors TRG, TRM and TRX, or the discharge transistor OFG) included in the sensor pixel 11. In such a case, it is possible to form the charge-holding section MEM to be large, thus making it possible to secure a larger number of saturated electrons.

Modification Example F

In the foregoing modification example E, the discharge transistor OFG may include, as the gate electrode, the two vertical gate electrodes VG and the coupling section CN, for example, as illustrated in FIGS. 19 and 20. In the discharge transistor OFG, one vertical gate electrode VG is provided in one sensor pixel 11 of two sensor pixels 11 adjacent to each other, and another vertical gate electrode VG is provided in another sensor pixel 11 of the two sensor pixels 11 adjacent to each other. In the discharge transistor OFG, the coupling section CN is in contact with the two vertical gate electrodes VG. That is, in the two sensor pixels 11 adjacent to each other, the two vertical gate electrodes VG are electrically coupled together via the coupling section CN, and the two sensor pixels 11 adjacent to each other share the coupling section CN (a portion of the gate electrode). Here, the term "share" means that the outputs of the two sensor pixels 11 adjacent to each other are controlled by the common coupling section CN.

In the present modification example, the light-blocking section 53 has the opening 53H at a location which is in contact with the separation section 54 and through which the vertical gate electrode VG included in the transfer transistor TRG and the vertical gate electrode VG included in the discharge transistor OFG penetrate. The transfer transistor TRG and the discharge transistor OFG provided in each sensor pixel 11 are arranged to be adjacent to each other, and the floating diffusion FD is disposed to be adjacent to a gap between the two vertical gate electrodes VG.

In the present modification example, the transfer transistor TRG and the discharge transistor OFG are provided in each sensor pixel 11. This improves the charge transfer from the photodiode PD to the floating diffusion FD, as compared with the case where one transfer transistor TRG is provided in each sensor pixel 11.

In the present modification example, the transfer transistor TRG and the discharge transistor OFG provided in each sensor pixel 11 are arranged to be adjacent to each other. Further, in each sensor pixel 11, the floating diffusion FD is disposed to be adjacent to the gap between the two vertical gate electrodes VG. This improves the charge transfer from the photodiode PD to the floating diffusion FD, as compared with the case where the floating diffusion FD is disposed away from the gap between the two vertical gate electrodes VG.

In the present modification example, there is provided, in the transfer transistor TRG, the coupling section CN in contact with the two vertical gate electrodes VG and electrically coupling the two vertical gate electrodes VG together. Further, in the present modification example, there is provided, in the discharge transistor OFG, the coupling section CN in contact with the two vertical gate electrodes VG and electrically coupling the two vertical gate electrodes VG together. This makes it possible to reduce the sizes of the transfer transistor TRG and the discharge transistor OFG, as compared with the case where the transfer transistor TRG and the discharge transistor OFG are provided for each sensor pixel 11 separately; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

In the present modification example, in the transfer transistor TRG, the two vertical gate electrodes VG are arranged to be opposed to each other with the separation section 54 interposed therebetween, and are in contact with the separation section 54. Further, the coupling section CN is in contact with the top of the separation section 54 and the top of each of the two vertical gate electrodes VG that are arranged to be opposed to each other. Further, in the present modification example, in the discharge transistor OFG, the two vertical gate electrodes VG are arranged to be opposed to each other with the separation section 54 interposed therebetween, and are in contact with the separation section 54. Further, the coupling section CN is in contact with the top of the separation section 54 and the top of each of the two vertical gate electrodes VG that are arranged to be opposed to each other. This makes it possible to reduce the sizes of the transfer transistor TRG and the discharge transistor OFG, as compared with the case where the transfer transistor TRG and the discharge transistor OFG are provided for each sensor pixel 11 separately; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

In the present modification example, the opening 53H is provided at a location which is in contact with the separation section 54 and through which the two vertical gate electrodes VG penetrate. This makes it possible to reduce the size of the transfer transistor TRG, as compared with the case where the transfer transistors TRG are provided separately for the respective sensor pixels 11; accordingly, it is possible to reduce the size of the opening 53H, of the light-blocking section 53, through which the vertical gate electrode VG penetrates. As a result, it is possible to suppress an increase in the noise and the pixel size. Therefore, it is possible to avoid deterioration of the charge transfer while suppressing the increase in the noise and the pixel size.

Modification Example G

In the foregoing modification example E, the transfer transistor TRG may further include, for each sensor pixel 11, one vertical gate electrode VG not coupled to the coupling section CN, for example, as illustrated in FIGS. 21 and 22. FIG. 21 illustrates a modification example of the planar configuration of the pixel array section 10 on the side of the logic circuit 20. FIG. 22 illustrates a modification example of the planar configuration of the pixel array section 10 on the side of the light-receiving surface 31A. It is to be noted that, in FIG. 21, a layout of various transistors (the reset transistor RST, the amplification transistor AMP, and the selection transistor SEL) included in the readout circuit 12 is overlapped on the planar configuration of the semiconductor substrate 31 on the side of the logic circuit 20. In addition, in FIG. 22, a layout of the vertical gate electrodes VG is overlapped on the planar configuration of the semiconductor substrate 31 on the side of the light-receiving surface 31A.

In the present modification example, each sensor pixel 11 includes the floating diffusion FD at a position adjacent to a gap between the vertical gate electrode VG coupled to the coupling section CN and the vertical gate electrode VG not coupled to the coupling section CN. This improves the charge transfer from the photodiode PD to the floating diffusion FD, as compared with the case where the floating diffusion FD is disposed away from the gap between the two vertical gate electrodes VG.

Modification Example H

In the foregoing embodiment and modification examples thereof, at least a location, of the separation sections 51 and 54, adjacent to a plurality of vertical gate electrodes VG may be formed by an oxide film. For example, as illustrated in FIGS. 23 and 24, a location, of the separation sections 51 and 54, adjacent to the plurality of vertical gate electrodes VG may be formed by an oxide film 54A. In addition, for example, as illustrated in FIGS. 25 and 26, the entire separation section 54 may be formed by the oxide film 54A. In addition, for example, as illustrated in FIGS. 27 and 28, there may be formed, in the separation section 54, the oxide film 54A extending from the light-receiving surface 31A to a location adjacent to the plurality of vertical gate electrodes VG.

The oxide film 54A is formed by embedding $SiO_2$ (silicon oxide) in a trench formed in the semiconductor substrate 31 using CVD, for example. In such a case, it is possible to prevent charges from leaking between two sensor pixels 11 adjacent to each other resulting from changes in potentials of the separation sections 51 and 54 when the gate of the transfer transistor TRG is turned ON. Consequently, it is possible to reduce noise caused by charge leakage.

Modification Example I

In the foregoing embodiment and modification examples thereof, for example, the vertical gate electrode VG may be formed to straddle two sensor pixels 11 adjacent to each other, as illustrated in FIG. 29. Even in such a case, it is possible to obtain effects similar to those of the foregoing embodiment and modification examples thereof.

Modification Example J

In the foregoing modification examples E, F, G, H, and I, a shape in a stacked plane of a region, of the semiconductor substrate 31, formed by the separation sections 51 and 54 surrounding the photodiode PD (hereinafter, referred to as a "first shape") and a shape in a stacked plane of a region, of the semiconductor substrate 31, formed by the separation sections 52 and 54 surrounding the floating diffusion FD or the charge-holding section MEM (hereinafter, referred to as a "second shape") may differ from each other. For example, the first shape may be a rectangular shape, and the second shape may be a shape closer to a square shape than the first shape.

Modification Example K

In the foregoing embodiment and modification examples thereof, the semiconductor substrate 31 may include an Si {111} substrate, for example. The Si {111} substrate is a single crystal silicon substrate or single crystal silicon wafer having a crystal plane represented by {111} in Mirror index notation. The crystal plane represented by {111} (a crystal plane represented by plane index {111}) extends along a plane (horizontal plane) orthogonal to a thickness direction in the single crystal silicon substrate or single crystal silicon wafer. In the present modification example, the Si {111} substrate also includes a substrate or wafer having a crystal orientation shifted several degrees, e.g., shifted several degrees from a {111} plane to a nearest [110] direction. In the present modification example, the Si {111} substrate also includes a silicon single crystal grown on a portion or the entire surface of the substrate or wafer by means of an epitaxial method or the like.

In addition, in the present modification example, the {111} plane is a generic term of a (111) plane, a (−111) plane, a (1-11) plane, a (11-1) plane, a (−1-11) plane, a (−11-1) plane, a (1-1-1) plane, and a (−1-1-1) plane, which are mutually equivalent crystal planes in terms of symmetry. Therefore, in the present modification example, the description of the Si {111} substrate may be read as an Si (1-11) substrate, for example. Here, a symbol of a bar for expressing an exponent in a negative direction of the Mirror index is substituted by a minus symbol.

In addition, in the present modification example, a <110> direction is a generic term of a [110] direction, a [101] direction, a [011] direction, a [−110] direction, a [1-10] direction, a [−101] direction, a [10-1] direction, a [0-11] direction, a [01-1] direction, a [−1-10] direction, a [−10-1] direction, and [0-1-1] direction, which are mutually equivalent crystal plane directions in terms of symmetry, and may be read as any of the above. In the present modification example, however, etching is performed in a direction orthogonal to an element-forming surface and in a direction further orthogonal to the direction orthogonal to the element-forming surface (i.e., a direction parallel to the element-forming surface).

Table 1 exhibits specific combinations of planes and orientations in which etching in the <110> direction is established in the {111} plane that is the crystal plane of the Si {111} substrate in the present modification example.

TABLE 1

| Etching Orientation | Element-Forming Surface | | | | | | | |
|---|---|---|---|---|---|---|---|---|
| | (111) | (−111) | (1-11) | (11-1) | (−1-11) | (−11-1) | (1-1-1) | (−1-1-1) |
| [110] | | ○ | ○ | | | ○ | ○ | |
| [101] | | ○ | | ○ | ○ | | ○ | |
| [011] | | | ○ | ○ | ○ | ○ | | |
| [−110] | ○ | | | ○ | ○ | | | ○ |
| [1-10] | ○ | | | ○ | ○ | | | ○ |
| [−101] | ○ | | ○ | | | ○ | | ○ |
| [10-1] | ○ | | ○ | | | ○ | | ○ |
| [0-11] | ○ | ○ | | | | | ○ | ○ |
| [01-1] | ○ | ○ | | | | | ○ | ○ |
| [−1-10] | | ○ | ○ | | | ○ | ○ | |
| [−10-1] | | ○ | | ○ | ○ | | ○ | |
| [0-1-1] | | | ○ | ○ | ○ | ○ | | |

As illustrated in Table 1, there are 96 (=8×12) combinations of the {111} plane and the <110> direction. However, in the present modification example, the <110> direction is limited to a direction orthogonal to the {111} plane that is an element-forming surface and a direction parallel to the element-forming surface. That is, in the present modification example, the combination of the element-forming surface in the Si {111} substrate and an orientation in which the etching is performed on the Si {111} substrate is selected from one of the combinations indicated by ○ in Table 1.

In the present modification example, it is possible to form the hollow section 58 by performing wet etching using the Si {111} substrate to allow the etching to proceed easily in a lateral direction (X-axis direction) in FIGS. 3, 16, and 23 to 28, but not to proceed easily at least in a vertical direction (Z-axis direction) among a depth direction (Y-axis direction) and the Z-axis direction in FIGS. 3, 16, and 23 to 28.

For example, it is possible to form the hollow section 58 by performing wet etching using a predetermined alkaline aqueous solution on the Si {111} substrate. As the alkaline aqueous solution, KOH, NaOH, CsOH, or the like is applicable for an inorganic solution, and EDP (ethylenediamine pyrocatechol aqueous solution), $N_2H_4$ (hydrazine), $NH_4OH$ (ammonium hydroxide), TMAH (tetramethylammonium hydroxide), or the like is applicable for an organic solution. Crystalline anisotropic etching utilizing properties of different etching rates is performed depending on the plane orientation of the Si {111} to thereby enable the formation of the hollow section 58.

Specifically, in the Si {111} substrate, an etching rate in the <110> direction, i.e., a direction with one or two Si backbonds is sufficiently higher than an etching rate in the <111> direction, i.e., a direction with three Si backbonds. Therefore, in the present modification example, the <110> direction, i.e., the direction with one or two Si backbonds is set as the X-axis direction, and the <111> direction, i.e., the direction with three Si backbonds is set as the Z-axis direction, thereby allowing the etching to proceed in the X-axis direction, but almost no etching to proceed at least in the Z-axis direction among the Y-axis direction and the Z-axis direction. Consequently, the hollow section 58 including a pair of first planes and a pair of second plane and third plane is formed within the semiconductor substrate 31 which is the Si {111} substrate. Thus, the light-blocking section 53 formed in the hollow section 58 also includes the pair of first planes and the pair of second planes and third plane.

To give description using a schematic explanatory view of FIG. 30, for example, when side of Si dangling bond is defined as a positive direction with respect to a normal line of an Si {111} plane, the Si backbond means an atomic bonding extending in a negative direction opposite to the positive direction. FIG. 30 exemplifies three backbonds at angles of −19.47° to +19.47° relative to the {111} plane. Specifically, in a case of providing the photodiode PD, the hollow section 58, the light-blocking section 53, and the charge-holding section MEM in the Si {111} substrate, the hollow section 58 and the light-blocking section 53 include the first plane along a first crystal plane of the Si {111} substrate being orthogonal to a first direction and represented by the plane index {111}, and the second plane along a second crystal plane of the Si {111} substrate being inclined relative to the first direction and represented by the plane index {111}.

The pair of first planes are each a plane along the first crystal plane of the semiconductor substrate 31, and are opposed to each other in the Z-axis direction. It is to be noted that the first crystal plane in the semiconductor substrate 31 is represented by the plane index {111}. The pair of second planes are each a plane along the second crystal plane of the semiconductor substrate 31, and are opposed to each other in the Y-axis direction. It is to be noted that the second crystal plane in the semiconductor substrate 31 is represented by the plane index {111}, and is inclined by about 19.5° relative to the Z-axis direction. That is, the inclination angle of the second crystal plane relative to the horizontal plane (X-Y plane) is about 70.5°. In addition, the second crystal plane is inclined relative to the X axis and the Y axis in the horizontal plane (X-Y plane), and forms an angle of about 300 relative to the Y axis, for example. The third plane is a plane along a third crystal plane of the semiconductor substrate 31. The third crystal plane of the semiconductor substrate 31 is inclined by about 19.5° relative to the Z-axis direction, similarly to the second crystal plane. That is, the inclination angle of the third crystal plane relative to the horizontal plane (X-Y plane) is about 70.5°.

It is to be noted that the Si {111} substrate also includes a case of a substrate of which a substrate surface is processed to have an off-angle relative to a <112> direction, for example, as illustrated in FIG. 31. In a case where the off-angle is 19.47° or less, even a substrate having an off-angle maintains a relationship in which an etching rate in the <110> direction, i.e., the direction with one Si backbond is sufficiently higher than an etching rate in the <111> direction, i.e. the direction with three Si backbonds. As the off-angle becomes larger, the number of steps increases, thus causing density of a micro step difference to be high; therefore, the off-angle is preferably 5° or less. Incidentally, FIG. 31 exemplifies the case where the substrate surface has an off-angle in the <112> direction; however, a case of having an off-angle in the <110> direction may also be employed, and it does not matter which direction the off-angle is in. In addition, an Si plane orientation is analyzable using an X-ray diffraction method, an electron beam diffraction method, an electron beam backscatter diffraction method, or the like. The number of Si backbonds is determined by an Si crystal structure, and thus the number of backbonds is also analyzable by analyzing the Si plane orientation.

In the present modification example, the hollow section 58 and the light-blocking section 53 are provided within the semiconductor substrate 31 which is the Si {111} substrate. The hollow section 58 and the light-blocking section 53 include the first plane along the first crystal plane and the second plane along the second crystal plane inclined relative to the first plane. Here, the first crystal plane and the second crystal plane are each represented by the plane index {111}. Therefore, the hollow section 58 is easily formable by crystalline anisotropic etching using an etching solution such as an alkaline aqueous solution, and has high dimensional accuracy.

3. Application Example

FIG. 32 illustrates an example of an outline configuration of an imaging system 2 including the solid-state imaging device 1 according to any of the foregoing embodiment and modification examples thereof. The imaging system 2 corresponds to a specific example of an "electronic apparatus" of the present disclosure. The imaging system 2 includes, for example, an optical system 210, the solid-state imaging device 1, a signal processing circuit 220, and a display unit 230.

The optical system 210 forms an image of image light (incident light) from a subject on an imaging surface of the solid-state imaging device 1. The solid-state imaging device 1 receives the image light (incident light) incident from the solid-state imaging device 1, and outputs a pixel signal corresponding to the received image light (incident light) to the signal processing circuit 220. The signal processing circuit 220 processes an image signal inputted from the solid-state imaging device 1, and generates picture data. The signal processing circuit 220 further generates a picture signal corresponding to the generated picture data, and outputs the generated picture signal to the display unit 230. The display unit 230 displays a picture based on the picture signal inputted from the signal processing circuit 220.

In the present application example, the solid-state imaging device 1 according to any of the foregoing embodiment and modification examples thereof is applied to the imaging system 2. This makes it possible to provide the imaging system 2 having high image quality with less noise.

4. Example of Practical Application to Mobile Body

The technology according to an embodiment of the present disclosure (present technology) is applicable to various products. For example, the technology according to an embodiment of the present disclosure may be achieved in the form of an apparatus to be mounted to a mobile body of any kind. Non-limiting examples of the mobile body may include an automobile, an electric vehicle, a hybrid electric vehicle, a motorcycle, a bicycle, any personal mobility device, an airplane, an unmanned aerial vehicle (drone), a vessel, and a robot.

FIG. 33 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 33, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 33, an audio speaker 12061, a display section 12062, and an instrument panel 12063 are illustrated as the output device. The display section 12062 may, for example, include at least one of an on-board display and a head-up display.

FIG. 34 is a diagram depicting an example of the installation position of the imaging section 12031.

In FIG. 34, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 34 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The description has been given hereinabove of one example of the mobile body control system, to which the technology according to an embodiment of the present disclosure may be applied. The technology according to an embodiment of the present disclosure may be applied to the imaging section 12031 among components of the configuration described above. Specifically, the solid-state imaging device 1 according to any of the foregoing embodiment and modification examples thereof is applicable to the imaging section 12031. The application of the technology according to an embodiment of the present disclosure to the imaging section 12031 allows for a high-quality captured image with less noise, thus making it possible to perform highly accurate control utilizing the captured image in the mobile body control system.

Although the description has been given hereinabove of the present disclosure with reference to the embodiment and modification examples thereof, the application example, and the practical application example, the present disclosure is not limited to the foregoing embodiment, etc., and may be modified in a wide variety of ways. It is to be noted that the effects described herein are merely illustrative. The effects of the present disclosure are not limited to those described herein. The present disclosure may have other effects than those described herein.

According to a first solid-state imaging device and a first electronic apparatus according to respective embodiments of the present disclosure, the vertical gate electrode reaching the photoelectric conversion section is provided, and, in a plurality of first pixels adjacent to each other among a plurality of pixels, the plurality of vertical gate electrodes are electrically coupled together. This makes it possible to avoid deterioration of charge transfer while suppressing an increase in noise and pixel size.

According to a second solid-state imaging device and a second electronic apparatus according to respective embodiments of the present disclosure, first and second vertical gate electrodes reaching the photoelectric conversion section are provided, and, in the plurality of first pixels adjacent to each other among a plurality of pixels, a plurality of first vertical gate electrodes are electrically coupled together and a plurality of second vertical gate electrodes are electrically coupled together. This makes it possible to avoid deterioration of charge transfer while suppressing an increase in noise and pixel size.

In addition, the present disclosure may also have the following configurations.

(1)
A solid-state imaging device including:
a light-receiving surface;
a plurality of pixels each including a photoelectric conversion section that photoelectrically converts light incident through the light-receiving surface; and
a separation section that electrically and optically separates each photoelectric conversion section,
each of the pixels including
a charge-holding section that holds charges transferred from the photoelectric conversion section,
a transfer transistor that includes a vertical gate electrode reaching the photoelectric conversion section, and transfers charges from the photoelectric conversion section to the charge-holding section, and
a light-blocking section disposed in a layer between the photoelectric conversion section and the charge-holding section, in which
a plurality of the vertical gate electrodes are electrically coupled together in a plurality of first pixels adjacent to each other among the plurality of pixels.

(2)
The solid-state imaging device according to (1), in which the first pixels share a coupling section that is in contact with the plurality of the vertical gate electrodes and electrically couples the plurality of the vertical gate electrodes together.

(3)
The solid-state imaging device according to (2), in which, in the plurality of first pixels,
the plurality of the vertical gate electrodes are arranged to be opposed to each other with the separation section interposed therebetween, and are in contact with the separation section, and
the coupling section is in contact with a top of the separation section and a top of each of the plurality of the vertical gate electrodes arranged to be opposed to each other.

(4)
The solid-state imaging device according to (3), in which the light-blocking section has an opening at a location which is in contact with the separation section and through which the vertical gate electrode penetrates.

(5)
The solid-state imaging device according to any one of (1) to (4), further including a semiconductor substrate including therein the light-blocking section, in which
the semiconductor substrate includes an Si {111} substrate including a first crystal plane represented by a plane index {111} extending along a plane orthogonal to a thickness direction, and
the light-blocking section includes
a first plane along the first crystal plane, and
a second plane inclined relative to the thickness direction and being along a second crystal plane of the Si {111} substrate.

(6)
A solid-state imaging device including:
a light-receiving surface;
a plurality of pixels each including a photoelectric conversion section that photoelectrically converts light incident through the light-receiving surface; and
a separation section that electrically and optically separates each photoelectric conversion section,
each of the pixels including
a charge-holding section that holds charges transferred from the photoelectric conversion section,
a transfer transistor that includes a first vertical gate electrode reaching the photoelectric conversion section, and transfers charges from the photoelectric conversion section to the charge-holding section,
a discharge transistor that includes a second vertical gate electrode reaching the photoelectric conversion section, and is disposed to be adjacent to the transfer transistor, the discharge transistor discharging charges from the photoelectric conversion section, and
a light-blocking section disposed in a layer between the light-receiving surface and the charge-holding section, in which
a plurality of the first vertical gate electrodes are electrically coupled together, and a plurality of the second vertical gate electrodes are electrically coupled together, in a plurality of first pixels adjacent to each other among the plurality of pixels.

(7)
The solid-state imaging device according to (6), in which, in the plurality of first pixels,
the plurality of the first vertical gate electrodes are arranged to be opposed to each other with the separation section interposed therebetween, and are in contact with the separation section,
the plurality of the second vertical gate electrodes are arranged to be opposed to each other with the separation section interposed therebetween, and are in contact with the separation section, and
the first pixels share
a first coupling section that is in contact with the plurality of the first vertical gate electrodes, and electrically couples the plurality of the first vertical gate electrodes together, and
a second coupling section that is in contact with the plurality of the second vertical gate electrodes, and electrically couples the plurality of the first vertical gate electrodes together.

(8)
The solid-state imaging device according to (7), in which in the plurality of first pixels, the plurality of the first vertical gate electrodes are arranged to be opposed to each other with the separation section interposed therebetween, and are in contact with the separation section, and
the first coupling section is in contact with a top of the separation section and a top of each of the plurality of the first vertical gate electrodes arranged to be opposed to each other, and
in the plurality of first pixels, the plurality of the second vertical gate electrodes are arranged to be opposed to each other with the separation section interposed therebetween, and are in contact with the separation section, and
the second coupling section is in contact with the top of the separation section and a top of each of the plurality of the second vertical gate electrodes arranged to be opposed to each other.

(9)
The solid-state imaging device according to (8), in which the light-blocking section has an opening at a location which is in contact with the separation section and through which the first vertical gate electrode and the second vertical gate electrode penetrate.

(10)
The solid-state imaging device according to any one of (6) to (9), in which the charge-holding section is disposed to be adjacent to a gap between the first vertical gate electrode and the second vertical gate electrode.

(11)
The solid-state imaging device according to any one of (6) to (10), further including a semiconductor substrate including therein the light-blocking section, in which
the semiconductor substrate includes an Si {111} substrate including a first crystal plane represented by a plane index {111} extending along a plane orthogonal to a thickness direction, and
the light-blocking section includes
a first plane along the first crystal plane, and
a second plane inclined relative to the thickness direction and being along a second crystal plane of the Si {111} substrate.

(12)
An electronic apparatus including:
a solid-state imaging device that outputs a pixel signal corresponding to incident light; and
a signal processing circuit that processes the pixel signal, the solid-state imaging device including
a light-receiving surface,
a plurality of pixels each including a photoelectric conversion section that photoelectrically converts light incident through the light-receiving surface, and
a separation section that electrically and optically separates each photoelectric conversion section,
each of the pixels including
a charge-holding section that holds charges transferred from the photoelectric conversion section,
a transfer transistor that includes a vertical gate electrode reaching the photoelectric conversion section, and transfers charges from the photoelectric conversion section to the charge-holding section, and
a light-blocking section disposed in a layer between the photoelectric conversion section and the charge-holding section, in which
a plurality of the vertical gate electrodes are electrically coupled together in a plurality of first pixels adjacent to each other among the plurality of pixels.

(13)
An electronic apparatus including:
a solid-state imaging device that outputs a pixel signal corresponding to incident light; and
a signal processing circuit that processes the pixel signal, the solid-state imaging device including
a light-receiving surface,
a plurality of pixels each including a photoelectric conversion section that photoelectrically converts light incident through the light-receiving surface, and
a separation section that electrically and optically separates each photoelectric conversion section,
each of the pixels including
a charge-holding section that holds charges transferred from the photoelectric conversion section,
a transfer transistor that includes a first vertical gate electrode reaching the photoelectric conversion section, and transfers charges from the photoelectric conversion section to the charge-holding section,
a discharge transistor that includes a second vertical gate electrode reaching the photoelectric conversion section, and is disposed to be adjacent to the transfer transistor, the discharge transistor discharging charges from the photoelectric conversion section, and
a light-blocking section disposed in a layer between the light-receiving surface and the charge-holding section, in which
a plurality of the vertical gate electrodes are electrically coupled together in a plurality of first pixels adjacent to each other among the plurality of pixels.

This application claims the benefit of Japanese Priority Patent Application JP2019-207923 filed with the Japan Patent Office on Nov. 18, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A solid-state imaging device, comprising:
a light-receiving surface;
a plurality of pixels that includes a first pixel and a second pixel, wherein each pixel of the plurality of pixels includes a photoelectric conversion section configured to:
photoelectrically convert light incident through the light-receiving surface; and
transfer charges based on the photoelectric conversion of the light;
a separation section configured to electrically and optically separate the photoelectric conversion section of the first pixel from the photoelectric conversion section of the second pixel,
wherein each pixel of the plurality of pixels further includes:
a charge-holding section configured to hold thecharges transferred from the photoelectric conversion section;
a transfer transistor that includes a vertical gate electrode, wherein
the vertical gate electrode reaches the photoelectric conversion section, and the transfer transistor is configured to transfer the charges from the photoelectric conversion section to the charge-holding section; and
a light-blocking section in a layer between the photoelectric conversion section and the charge-holding section;
a coupling section; and
a plurality of vertical gate electrodes that includes the vertical gate electrode, wherein
vertical gate electrodes of the plurality of vertical gate electrodes are electrically coupled in a plurality of first pixels among the plurality of pixels,
pixels in the plurality of first pixels are adjacent,
the plurality of first pixels shares the coupling section,
the coupling section is in contact with the plurality of vertical gate electrodes,
the coupling section is configured to electrically couple the plurality of vertical gate electrodes, and
in the plurality of first pixels that includes the first pixel and the second pixel:
the vertical gate electrode in the first pixel is opposite to the vertical gate electrode in the second pixel,
the separation section is between the vertical gate electrode of the first pixel and the vertical gate electrode of the second pixel,
the plurality of vertical gate electrodes is in contact with the separation section, and
the coupling section is in contact with a top of the separation section and a top of each of the plurality of vertical gate electrodes.

2. The solid-state imaging device according to claim 1, wherein the light-blocking section has an opening at a location, in the solid-state imaging device, which is in contact with the separation section and through which the vertical gate electrode penetrates.

3. The solid-state imaging device according to claim 1, further comprising a semiconductor substrate that includes the light-blocking section, wherein
the semiconductor substrate comprises an Si {111} substrate that includes a first crystal plane represented by a plane index {111},
the plane index {111} extends along a plane orthogonal to a thickness direction in the Si {111} substrate, and
the light-blocking section includes:
a first plane along the first crystal plane, and
a second plane inclined relative to the thickness direction and being along
a second crystal plane of the Si {111} substrate.

4. A solid-state imaging device, comprising:
a light-receiving surface;
a plurality of pixels that includes a first pixel and a second pixel, wherein each pixel of the plurality of pixels includes a photoelectric conversion section configured to:
photoelectrically convert light incident through the light-receiving surface; and
transfer charges based on the photoelectric conversion of the light; and
a separation section configured to electrically and optically separate the photoelectric conversion section of the first pixel from the photoelectric conversion section of the second pixel,
wherein each pixel of the plurality of pixels includes:
a charge-holding section configured to hold the charges transferred from the photoelectric conversion section,
a transfer transistor that includes a first vertical gate electrode, wherein
the first vertical gate electrode reaches the photoelectric conversion section, and
the transfer transistor is configured to transfer the charges from the photoelectric conversion section to the charge-holding section,
a discharge transistor that includes a second vertical gate electrode, wherein
the second vertical gate electrode reaches the photoelectric conversion section,
the discharge transistor is adjacent to the transfer transistor, and
the discharge transistor is configured to discharge the charges from the photoelectric conversion section, and
a light-blocking section in a layer between the light-receiving surface and the charge-holding section, wherein
a plurality of first vertical gate electrodes is electrically coupled together, and a plurality of second vertical gate electrodes is electrically coupled together, in a plurality of first pixels among the plurality of pixels,
pixels in the plurality of first pixels are adjacent,
the plurality of first vertical gate electrodes includes the first vertical gate electrode, and
the plurality of second vertical gate electrodes includes the second vertical gate electrode.

5. The solid-state imaging device according to claim 4, further comprising a first coupling section and a second coupling section, wherein
in the plurality of first pixels that includes the first pixel and the second pixel:
the first vertical gate electrode of the first pixel is opposite to the first vertical gate electrode of the second pixel,
the separation section is between the first vertical gate electrode of the first pixel and the first vertical gate electrode of the second pixel,
the first vertical gate electrode of the first pixel and the first vertical gate electrode of the second pixel are in contact with the separation section,
the second vertical gate electrode of the first pixel is opposite to the second vertical gate electrode of the second pixel,
the separation section is between the second vertical gate electrode of the first pixel and the second vertical gate electrode of the second pixel, and
the second vertical gate electrode of the first pixel and the second vertical gate electrode of the second pixel are in contact with the separation section, and the plurality of first pixels shares:
the first coupling section that is in contact with the plurality of first vertical gate electrodes, wherein the first coupling section is configured to electrically couple the plurality of first vertical gate electrodes together, and
the second coupling section that is in contact with the plurality of second vertical gate electrodes, wherein the second coupling section is configured to electrically couple the plurality of second vertical gate electrodes together.

6. The solid-state imaging device according to claim 5, wherein
the first coupling section is in contact with a top of the separation section and a top of each of the plurality of first vertical gate electrodes, and
the second coupling section is in contact with the top of the separation section and a top of each of the plurality of second vertical gate electrodes.

7. The solid-state imaging device according to claim 6, wherein the light-blocking section has an opening at a location, in the solid-state imaging device, which is in contact with the separation section and through which the first vertical gate electrode and the second vertical gate electrode penetrate.

8. The solid-state imaging device according to claim 4, wherein the charge-holding section is adjacent to a gap between the first vertical gate electrode of the first pixel and the second vertical gate electrode of the first pixel.

9. The solid-state imaging device according to claim 4, further comprising a semiconductor substrate that includes the light-blocking section, wherein
the semiconductor substrate comprises an Si $\{111\}$ substrate that includes a first crystal plane represented by a plane index $\{111\}$,
the plane index $\{111\}$ extends along a plane orthogonal to a thickness direction in the Si $\{111\}$ substrate, and
the light-blocking section includes:
a first plane along the first crystal plane, and
a second plane inclined relative to the thickness direction and being along a second crystal plane of the Si $\{111\}$ substrate.

10. An electronic apparatus, comprising:
a solid-state imaging device configured to output a pixel signal corresponding to incident light; and
a signal processing circuit configured to process the pixel signal, wherein the solid-state imaging device includes:
a light-receiving surface;
a plurality of pixels that includes a first pixel and a second pixel, wherein each pixel of the plurality of pixels includes a photoelectric conversion section configured to:
photoelectrically convert light incident through the light-receiving surface; and
transfer charges based on the photoelectric conversion of the light;
a separation section configured to electrically and optically separate the photoelectric conversion section of the first pixel from the photoelectric conversion section of the second pixel,
wherein each pixel of the plurality of pixels further includes:
a charge-holding section configured to hold the charges transferred from the photoelectric conversion section;
a transfer transistor that includes a vertical gate electrode, wherein
the vertical gate electrode reaches the photoelectric conversion section, and
the transfer transistor is configured to transfer the charges from the photoelectric conversion section to the charge-holding section and
a light-blocking section in a layer between the photoelectric conversion section and the charge-holding section;
a coupling section; and
a plurality of vertical gate electrodes that includes the vertical gate electrode, wherein
vertical gate electrodes of the plurality of vertical gate electrodes are electrically coupled in a plurality of first pixels among the plurality of pixels,
pixels in the plurality of first pixels are adjacent,
the plurality of first pixels shares the coupling section,
the coupling section is in contact with the plurality of vertical gate electrodes,
the coupling section is configured to electrically couple the plurality of vertical gate electrodes, and
in the plurality of first pixels that includes the first pixel and the second pixel:
the vertical gate electrode in the first pixel is opposite to the vertical gate electrode in the second pixel,
the separation section is between the vertical gate electrode of the first pixel and the vertical gate electrode of the second pixel,
the plurality of vertical gate electrodes is in contact with the separation section, and
the coupling section is in contact with a top of the separation section and a top of each of the plurality of vertical gate electrodes.

11. An electronic apparatus, comprising:
a solid-state imaging device configured to output a pixel signal corresponding to incident light; and
a signal processing circuit configured to process the pixel signal, wherein the solid-state imaging device includes:
a light-receiving surface;
a plurality of pixels that includes a first pixel and a second pixel, wherein each pixel of the plurality of pixels includes a photoelectric conversion section configured to:
photoelectrically convert light incident through the light-receiving surface; and
transfer charges based on the photoelectric conversion of the light; and
a separation section configured to electrically and optically separate the photoelectric conversion section of the first pixel from the photoelectric conversion section of the second pixel,
wherein each pixel of the plurality of pixels includes:
a charge-holding section configured to hold the charges transferred from the photoelectric conversion section,
a transfer transistor that includes a first vertical gate electrode, wherein
the first vertical gate electrode reaches the photoelectric conversion section, and
the transfer transistor is configured to transfer the charges from the photoelectric conversion section to the charge-holding section,
a discharge transistor that includes a second vertical gate electrode, wherein
the second vertical gate electrode reaches the photoelectric conversion section,
the discharge transistor is adjacent to the transfer transistor, and
the discharge transistor is configured to discharge the charges from the photoelectric conversion section, and
a light-blocking section in a layer between the light-receiving surface and the charge-holding section, wherein
a plurality of vertical gate electrodes is electrically coupled together, in a plurality of first pixels among the plurality of pixels, pixels in the plurality of first pixels are adjacent,
the plurality of vertical gate electrodes includes the first vertical gate electrode, and
the plurality of vertical gate electrodes is different from the second vertical gate electrode.

* * * * *